(12) United States Patent
Miyahara

(10) Patent No.: US 8,497,677 B2
(45) Date of Patent: Jul. 30, 2013

(54) CURRENT SENSING DEVICE AND MANUFACTURING METHOD OF THE SAME

(75) Inventor: Norio Miyahara, Kumagaya (JP)

(73) Assignee: DENSO CORPORATION, Kariya (JP)

( * ) Notice: Subject to any disclaimer, the term of this patent is extended or adjusted under 35 U.S.C. 154(b) by 404 days.

(21) Appl. No.: 12/805,765

(22) Filed: Aug. 19, 2010

(65) Prior Publication Data

US 2011/0043200 A1    Feb. 24, 2011

(30) Foreign Application Priority Data

Aug. 21, 2009    (JP) .................................. 2009-192126

(51) Int. Cl.
*G01R 33/02* (2006.01)

(52) U.S. Cl.
USPC ........................................................ 324/244

(58) Field of Classification Search
USPC ........................................................ 324/244
See application file for complete search history.

(56) References Cited

U.S. PATENT DOCUMENTS

| | | | | |
|---|---|---|---|---|
| 5,241,263 A | * | 8/1993 | Naoi et al. ............... | 324/117 H |
| 5,523,677 A | * | 6/1996 | Kawakami et al. ....... | 324/117 R |
| 2003/0227284 A1 | * | 12/2003 | Marasch et al. .......... | 324/117 H |
| 2005/0040723 A1 | * | 2/2005 | Asai et al. ................ | 310/156.53 |
| 2005/0083155 A1 | * | 4/2005 | Attarian et al. .......... | 335/18 |
| 2005/0179334 A1 | * | 8/2005 | Yoshinaga ................ | 310/156.47 |
| 2005/0237049 A1 | * | 10/2005 | Ozaki et al. .............. | 324/117 H |
| 2006/0043960 A1 | * | 3/2006 | Itoh et al. ................. | 324/117 R |
| 2007/0247012 A1 | * | 10/2007 | Shin et al. ................ | 310/156.06 |
| 2008/0129243 A1 | * | 6/2008 | Nashiki .................... | 318/701 |
| 2009/0009280 A1 | * | 1/2009 | Ishihara ................... | 336/234 |
| 2009/0194084 A1 | * | 8/2009 | Kojima et al. ............ | 123/634 |
| 2009/0261813 A1 | * | 10/2009 | Nishiura et al. .......... | 324/117 R |
| 2010/0097049 A1 | * | 4/2010 | Lepine et al. ............ | 324/117 H |
| 2012/0032674 A1 | * | 2/2012 | Rajula et al. ............. | 324/253 |

FOREIGN PATENT DOCUMENTS

| | | |
|---|---|---|
| JP | 09-281152 A | 10/1997 |
| JP | 2002-296305 A | 10/2002 |
| JP | 3790147 B2 | 6/2006 |
| JP | 2008-224488 A | 9/2008 |

* cited by examiner

*Primary Examiner* — Jermele M Hollington
*Assistant Examiner* — Demetrius Pretlow
(74) *Attorney, Agent, or Firm* — Posz Law Group, PLC

(57) ABSTRACT

A current sensing device and a manufacturing method of the same are disclosed. The current sensing device includes: a core having a gap; and a magnetic sensor inserted in the gap. The core includes a first core member and a second core member each made of a grain-oriented magnetic steel sheet having a magnetization easy axis. The first and second core members are stacked into a multiple layer structure so that a direction of the magnetization easy axis of the first core member and that of the second core member are perpendicular to each other. The first core member has a first trap part. The second core member has a second trap part.

8 Claims, 22 Drawing Sheets

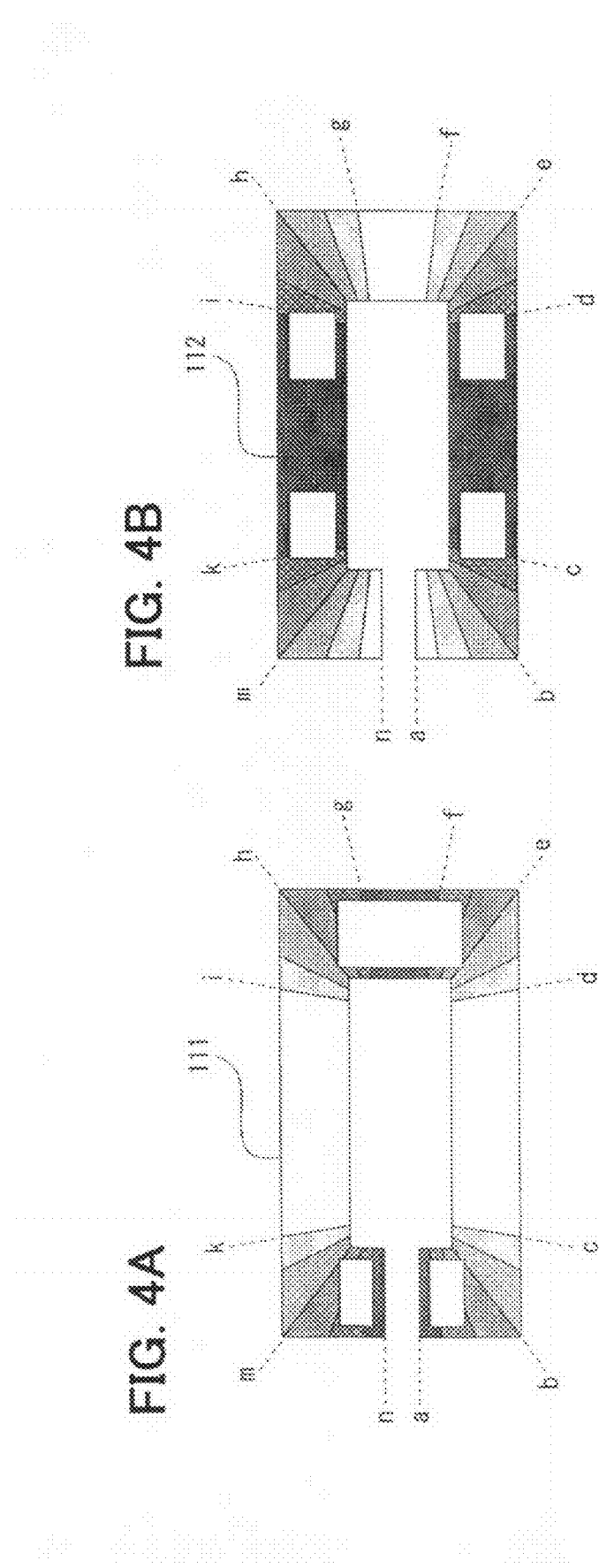
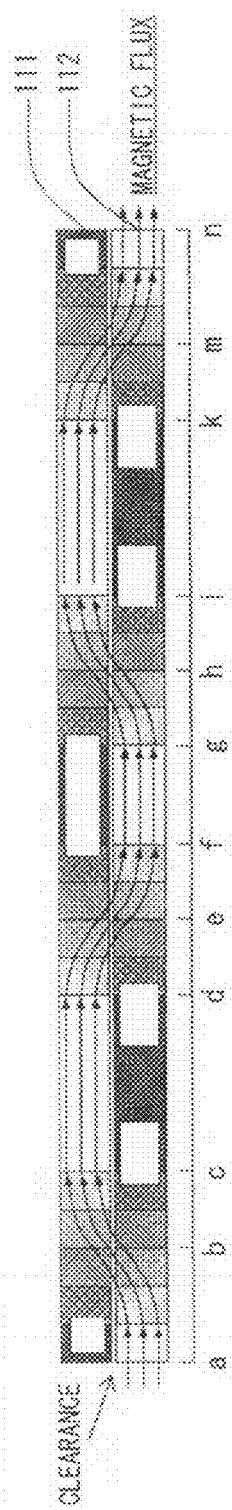
FIG. 4A
FIG. 4B
FIG. 4C

|  | MAX. CURRENT | HYSTERESIS WIDTH |
|---|---|---|
| WITH TRAP | 338.1A | 0.125mT |
| WITHOUT TRAP | 322.9A | 0.109mT |

MAG. EASY AXIS "A"

MAG. EASY AXIS "A"

FIG. 24
RELATED ART

| MATERIAL | COERCIVE Hc (A/m) | MAGNETIC FLUX DENSITY (T) |
|---|---|---|
| PERMALLOY (78%Ni) | 1.6 | 0.5 |
| PERMALLOY (45%Ni) | 7.0 | 1.5 |
| GRAIN-ORIENTED MAGNETIC STEEL (∥ MAG. EASY AXIS) | 5.0 | 2.0 |
| GRAIN-ORIENTED MAGNETIC STEEL (⊥ MAG. EASY AXIS) | 180.0 | 1.3 |

CURRENT SENSING DEVICE AND MANUFACTURING METHOD OF THE SAME

CROSS REFERENCE TO RELATED APPLICATION

The present application is based on Japanese Patent Application No. 2009-192126 filed on Aug. 21, 2009, disclosure of which is incorporated herein by reference.

BACKGROUND OF THE INVENTION

1. Field of the Invention

The present invention relates to a current sensing device and a manufacturing method of the same. The present invention can in particular relate to a current sensing device that senses a current in such way that a magnetic sensor inserted in a gap of a core detects a magnetic field that is generated in the core in response to the current.

2. Description of Related Art

There is known a current sensing device that detects a current flowing into or from, for example, a battery of a vehicle and the like. This kind of current sensing device is typically configured as follows. The current sensing device includes a core and a magnetic sensor inserted in a gap formed in a core. The magnetic sensor detects a magnetic field that is generated in the core in response to a current flowing in a conductive wire connected to the battery. In the current sensing device, since a measurement target current (i.e., a current to be measured) is proportional to the density of magnetic flux generated in a core gap, the current sensing device is also called a magnetic proportional type current sensing device.

The inventor of the present application has studied a current sensing device, discussion on which will be given below with the findings of the inventor of the present application.

A core of a magnetic proportional type current sensing device may be made of a soft magnetic material. The soft magnetic material can be slightly magnetized by the magnetic field that is generated in response to the measurement target current.

When the core is magnetized, the magnetic filed is generated in the core gap even when the measurement target current does not flow. An output of the magnet sensor can have an offset. In order to reduce the offset, a material with a small coercivity may be required as a material of the core of the current sensing device.

Permalloy is generally known as a magnetic material with a small coercivity.

Permalloy is however nickel alloy, which is approximately 10 to 50 times as expensive as iron and steel.

In view of the above, the use of inexpensive iron or steel as a core material is studied. In iron and steel, a grain-oriented magnetic steel sheet is a material with a relatively small coercivity. More specifically, the grain-oriented magnetic steel sheet (also called a grain-oriented electrical steel sheet and stripe) is a steel material that has a sheet shape and has a magnetization easy axis in a certain direction thereof. The grain-oriented magnetic steel sheet has a remarkably small coercivity in a direction of the magnetization easy axis.

FIG. 23 is a diagram illustrating a property of a grain-oriented magnetic steel sheet. The illustrated property is magnetic flux density as a function of magnetizing force. FIG. 24 is a diagram illustrating coercivity and saturation magnetic flux density of a grain-oriented magnetic steel sheet in a direction of the magnetization easy axis and a direction perpendicular to the magnetization easy axis. In FIG. 23, the solid line shows the property of the grain-oriented magnetic steel sheet in the direction of the magnetization easy axis, and the dashed line shows the property of the grain-oriented magnetic steel sheet in the direction perpendicular to the magnetization easy axis. In FIG. 23, the coercivity is shown by an intersection point between the horizontal axis magnetizing force and the lines (solid line, dashed line).

As shown in FIG. 24, the permalloy with a nickel content rate of 78% has, as the magnetic property thereof, a coercivity of approximately 1.6 A/m and a magnetic flux density of approximately 0.5 T. The permalloy with a nickel content rate of 45% has, as the magnetic property thereof, a coercivity of approximately 7 A/m and a magnetic flux density of approximately 1.5 T. A material for the core of the current sensing device may need to have a magnetic property provided by the permalloy with a nickel content rate of approximately 45%.

As shown in FIGS. 23 and 24, a grain-oriented magnetic steel sheet can have a coercivity of approximately 5 A/m and a magnetic flux density of approximately 2.0 T in the direction of the magnetization easy axis. In the direction perpendicular to the magnetization easy axis, the grain-oriented magnetic steel sheet can have a coercivity of approximately 180 A/m and a magnetic flux density of approximately 1.3 T. As can be seen from the above, the grain-oriented magnetic steel sheet has, in the direction of the magnetization easy axis, the magnetic property required for the core of the current sensing device.

Hence, when the core is constructed with use of a grain-oriented magnetic steel sheet, it is necessary to form a magnetic path in the direction of the magnetization easy axis.

FIGS. 25A and 25B are diagrams illustrating one example structure of a core made with a grain-oriented magnetic steel sheet.

A core 300 made with a grain-oriented magnetic steel sheet can be formed through the following steps. As shown in FIG. 25A, a grain-oriented magnetic steel sheet 301 is wound in the direction of the magnetization easy axis. As shown in FIG. 25B, an end part 302 of the wound grain-oriented magnetic steel plate 301 is fixed by welding or the like, and then, a gap 304 is formed by cutting a part of the wound grain-oriented magnetic steel plate 301 using a cutter 303 or the like.

FIG. 26 is a diagram illustrating one example structure of a core made with permalloy.

A core 400 made with permalloy can be formed through: press-working a plate made of permalloy into a shape that has a gap 401 and a center hole 402 etc.; and stacking multiple press-worked plates into a multilayer structure.

As can be seen from the above, the core 300 made with the grain-oriented magnetic steel sheet may involves complicated manufacturing processes including a step of winding the grain-oriented magnetic steel sheet, a step of fixing the end part of the wound grain-oriented magnetic steel sheet, a step of forming the gap by cutting the part of the wound grain-oriented magnetic steel sheet, and the like. By contrast, the core 400 made with permalloy can be formed through press-working the plate and stacking the press-worked plates into a multilayer structure. Therefore, although the core 300 made with a grain-oriented magnetic steel sheet can be manufactured with low-priced materials, the core 300 made with a grain-oriented magnetic steel sheet may involve complicated working processes and worse assembly performance as compared to the core 400 made with permalloy.

The inventor of the present application considered that it is necessary to improve assembly performance of a core made with a grain-oriented magnetic steel sheet. Meanwhile, the inventor has found that if a grain-oriented magnetic steel sheet, which has a magnetization easy axis, is press-worked and stacked in a manner similar to the manufacturing of the core made with permalloy, a magnetic flux flows in the stacked grain-oriented magnetic steel sheets in the direction perpendicular to the magnetization easy axis, and the stacked grain-oriented magnetic steel sheets may have a large hysteresis and a small maximum measurement current due to the magnetization.

Japanese Patent No. 3790147 and Japanese Patent Unexamined Application Publication No. 2008-224488 have proposed a core made with a grain-oriented magnetic steel sheet. In such cores, a grain-oriented magnetic steel sheet are press-worked to form two kinds of core members whose magnetization easy axes are perpendicular to each other, and the two kinds of core members are alternately stacked into a multi-layer structure so that the averaged magnetic permeability is the same all around each core member.

When the core made with a grain-oriented magnetic steel sheet is manufactured in the above-described way, a core made with a grain-oriented magnetic steel sheet can be manufactured through the substantially same manufacturing processes as the core made with permalloy is manufactured.

In the following, explanation is given on properties of the core that is formed through: press-working an grain-oriented magnetic steel sheet to form two kinds of core members whose magnetization easy axes are perpendicular to each other; and alternately stacking the two kinds of core members into a multilayer structure so that the averaged magnetic permeability is the same all around each core member.

FIGS. 27A to 27C are diagrams for explanation on a magnetic path of a core having stacked core members made of a grain-oriented magnetic steel sheet. In FIGS. 27A to 27C, the magnetic path formed in a core 1100 is represented by the arrow, and the magnetic permeability is represented by contrasting density. In FIGS. 27A to 27C, the high contrasting density represents a portion with a small magnetic permeability, and the low contrasting density represents a portion with a large magnetic permeability.

The core 1100 includes a core member 1110 and a core member 1120 each having a rectangular ring shape. The core member 1110 is processed so to have a magnetization easy axis in a direction of a long side portion thereof. The direction of a short side portion of the core member 1110 is perpendicular to the magnetization easy axis of the core member 1110.

The core member 1120 of the core 1100 is processed so as to have an magnetization easy axis in a direction of a short side portion thereof. A direction of a long side portion of the core member 1120 is perpendicular to the magnetization easy axis.

In the core 1100, the core member 1110 and the core member 1120 are stacked.

FIG. 27C is a diagram illustrating the stacked core members that are, for explanation purpose, rolled out from a gap G in an anticlockwise direction.

Explanation will be given on distribution of magnetic flux in the core members 1110 and 1120, where the magnetic flux is generated by a magnetic field resulting from a current flowing through a center part of the core members 1110 and 1120.

When a comparison is made between the magnetic permeability of the core member 1110 and that of the core member 1120 at the point "a" shown in FIGS. 27A to 27C, the magnetic permeability of the core member 1120 is predominantly larger than that of the core member 1110, and thus, all of the magnetic flux passes through the core member 1120. In an interval from the point "a" to the point "c", the magnetic permeability of the core member 1120 is on the decrease while the magnetic permeability of the core member 1110 is on the increase.

At the point "b", the magnetic permeability of the core member 1110 and that of the core member 1120 become approximately equal to each other. Thus, in the vicinity of the point "b", the magnetic flux is approximately uniformly distributed in the core members 1110 and 1120. As closer to the point "c", the magnetic permeability of the core member 1110 is larger. Thus, in an interval between the point "c" and the point "d", the magnetic flux is moved to the core member 1110.

After the magnetic flux passes through the interval between the point "c" and the point "d" of the core member 1110, the magnetic flux is moved to the core member 1120 in an interval between the point "d" and the point "e" because of a decrease in magnetic permeability of the core member 1110 and an increase in magnetic permeability of the core member 1120. In an interval between the point "f" and the point "g", all magnetic flux is moved into the core member 1120. In a manner similar to the above, the magnetic flux is moved in an interval between the point "g" and the point "i" and an interval between the point "k" and the point "n".

As can be seen from the above, when the core members 1110, 1120 each made of a grain-oriented magnetic steel sheet are stacked so that the magnetization easy axis of the core member 1110 and that of the core member 1120 are perpendicular each other, the magnetic flux generally flows in a portion of the core member 1110 or 1120 in the direction of the magnetization easy axis, and the magnetic flux generally does not flow in a portion of the core member 1110 or 1120 in the direction perpendicular to the magnetization easy axis.

Although it is ideal that the core member 1110 and the core member 1120 are assembled so as to firmly stick each other, a tiny clearance exists in a practical sense. Since the magnetic permeability of the clearance is approximately equal to that of vacuum, the clearance acts as a resistance for the magnetic flux to move between the core member 1110 and the core member 1120. Since the magnetic resistance is larger with increasing clearance, a part of the magnetic flux may not move between the core member 1110 and the core member 1120 in the case of a large clearance.

This has a negative influence on magnetic saturation properties of a core generally required in a current sensing device as a whole. For example, a maximum measurement current is lowered. Coercivity is worsened, that is, hysteresis is increased.

SUMMARY OF THE INVENTION

In view of the above and other points, it is an objective of the present invention to provide a current sensing device that can ensure a required magnetic property and a required output property, and that can be efficiently manufactured at low cost. It is also an objective of the present invention to provide a manufacturing method of such a current sensing device.

According to a first aspect of the present invention, there is provided a current sensing device for sensing a current. The current sensing device includes: a core having a gap; and a magnetic sensor inserted in the gap of the core and configured to detect a magnetic flux that is generated in the core in response to the current, thereby sensing the current. The core includes a first core member and a second core member each made of a grain-oriented magnetic steel sheet, which has a magnetization easy axis in a predetermined direction thereof. The first core member and the second core member are stacked into a multiple layer structure so that a direction of the magnetization easy axis of the first core member and that of the second core member are perpendicular to each other. The first core member has a first trap part that suppresses flow of the magnetic flux in the first core member in a direction perpendicular to the magnetization easy axis of the first core member. The second core member has a second trap part that suppresses flow of the magnetic flux in the second core member in a direction perpendicular to the magnetization easy axis of the second core member.

According to a second aspect of the present invention, there is provided a method of manufacturing a core of a current sensing device, the current sensing device including a magnetic sensor inserted in a gap of the core to detect a magnetic flux that is generated in the core in response to a current to be sensed. The method includes: forming a first core member that is made of a grain-oriented magnetic steel sheet having a magnetization easy axis in a predetermination direction thereof, and that has a first trap part which suppresses flow of the magnetic flux in the first core member in a direction perpendicular to the magnetization easy axis of the first core member; forming a second core member that is made of a grain-oriented magnetic steel sheet having a magnetization easy axis in a predetermination direction thereof, and that has a second trap part which suppresses flow of the magnetic flux in the second core member in a direction perpendicular to the magnetization easy axis of the second core member; and stacking the first core member and the second core member into a multilayer structure so that the magnetization easy axis of the first core member and that of the second core member are perpendicular to each other.

According to the above first aspect and second aspect, the flow of magnetic flux in the first core member in the direction perpendicular to the magnetization easy axis of the first core member can be suppressed by the first trap part. The flow of magnetic flux in the second core member in the direction perpendicular to the magnetization easy axis of the second core member can be suppressed by the second trap part. Because of the multilayer structure and the first and second trap parts, the first core member and the second core member can cooperate with each other to form a magnetic circuit in which the magnetic flux is guided to a magnetization easy axis portion (i.e., a portion that extends in the direction of the magnetization easy axis and that allows the magnetic flux to flow therein in the direction of the magnetization easy axis). Therefore, even if there is a clearance between the first core member and the second core member, the current sensing device can provide an ideal property of output in response to a current to be measured.

BRIEF DESCRIPTION OF THE DRAWINGS

The above and other objects, features and advantages of the present invention will become more apparent from the following detailed description made with reference to the accompanying drawings. In the drawings:

FIGS. 4A to 4C are diagrams illustrating a magnetic path formed in a core according to one embodiment;

FIG. 24 is a diagram illustrating coercivity and magnetic flux density of permalloy and grain-oriented magnetic steel;

DETAILED DESCRIPTION OF EXEMPLARY EMBODIMENTS

The exemplary embodiments will be described below with reference to the drawings.

Figure 1:
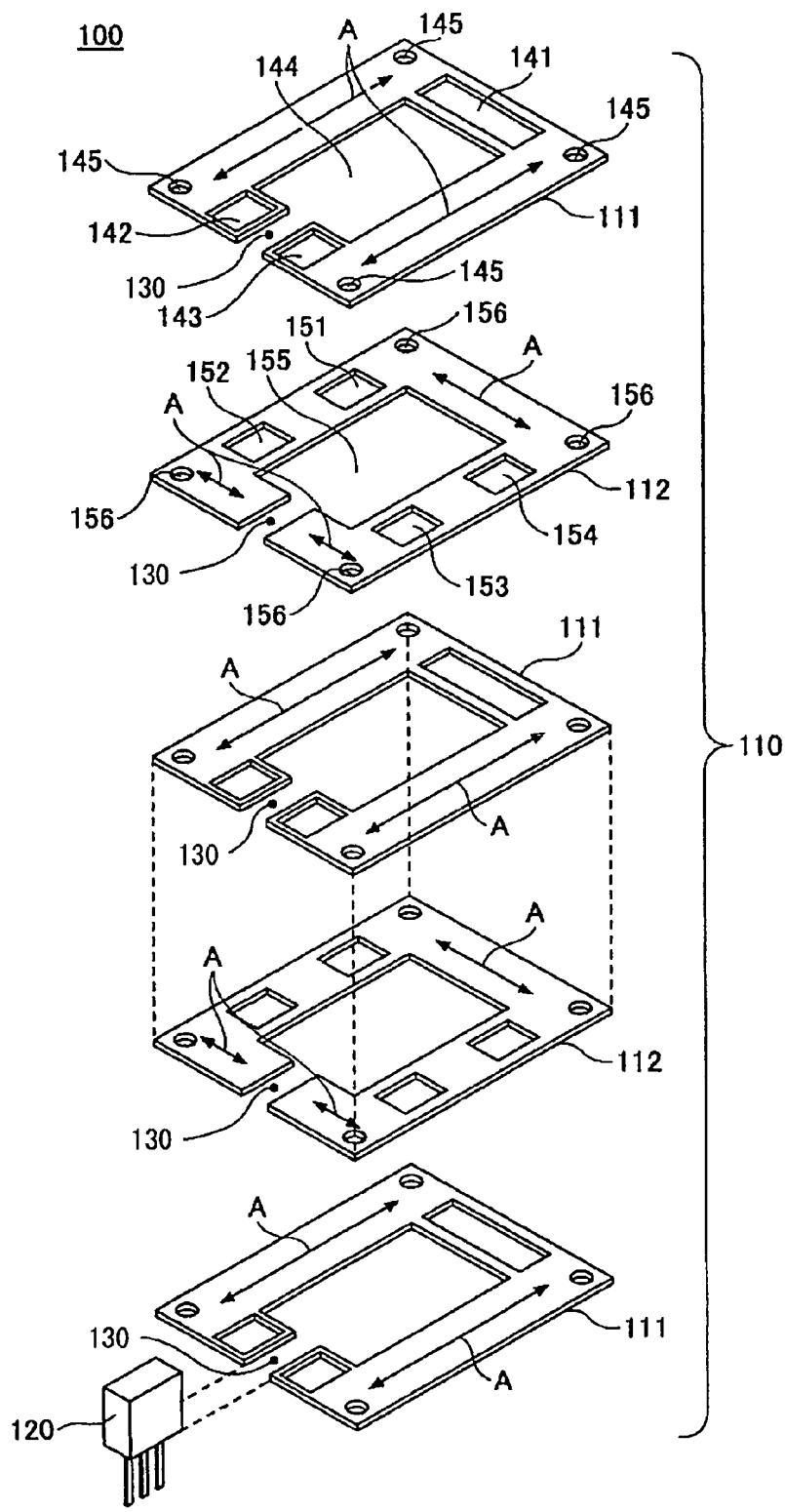
FIG. 1 is an exploded perspective view of a current sending device according to one embodiment.
Figure 2:
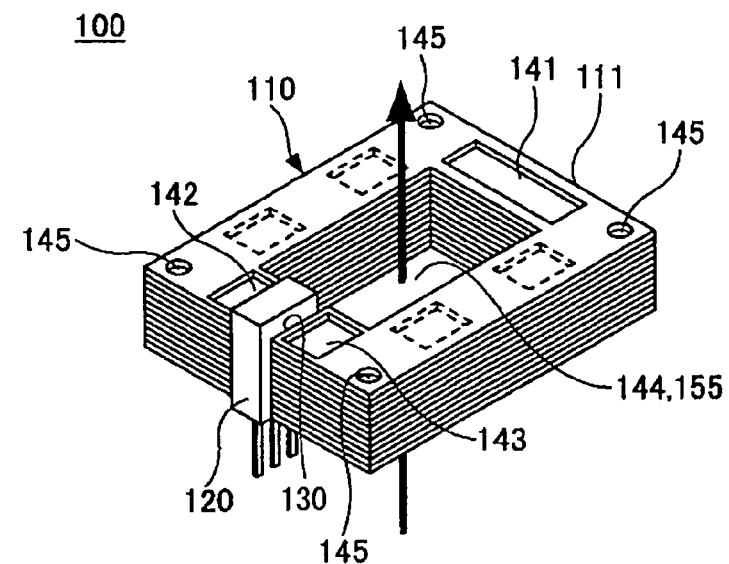
FIG. 2 is a perspective view of an assembled current sensing device according to one embodiment.

FIG. 1 illustrates an exploded perspective view of a current sensing device 100 according to one embodiment. FIG. 2 illustrates an assembled current sensing device 100 according to one embodiment.

The current sensing device 100 includes a core 110 and a magnetic sensor 120.

A conductive wire penetrates through the core 110. When a current flows in the conductive wire, a magnetic flux flows in the core 110 in response to the flowing current. The core 110 forms a magnetic path. The core 110 has a gap 130 in the course of the magnetic path. The magnetic sensor 120 is inserted in the gap 130.

The magnetic flux flowing in the core 110 penetrates through the magnetic sensor 120 at the gap 130. The magnetic sensor 120 includes, for example, a hall element or the like, and outputs an electric signal indicative of the magnetic flux penetrating therethrough. The electric signal outputted from the magnetic sensor 120 is proportional to the current flowing in the conductive wire.

The core 110 includes a first core member 111 and a second core member 112, which are stacked into a multilayer structure. The core 110 may include multiple first core members 111 and multiple second core members 112 alternately staked into a multilayer structure.

Figure 3A:
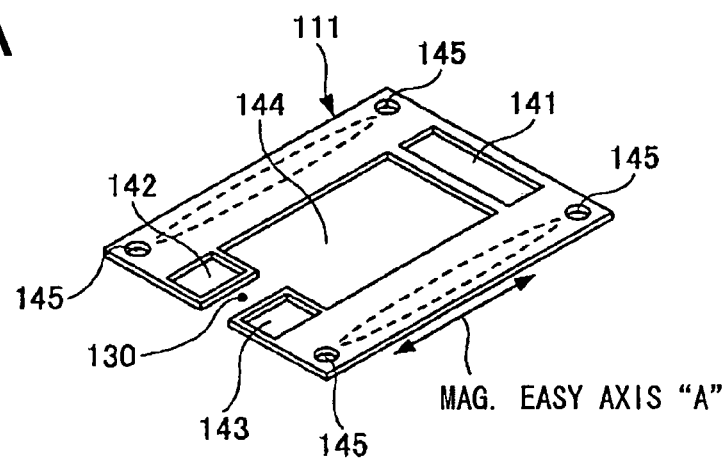
FIGS. 3A and 3B are respectively perspective view of a first core member and a second core member according to one embodiment.
Figure 3B:
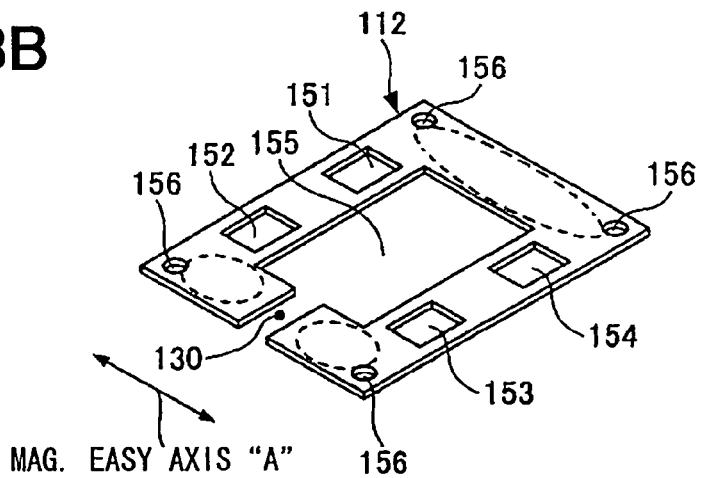

FIGS. 3A and 3B illustrate perspective views of the first core member 111 and the second core member 112, respectively.

Each of the first core member 111 and the second core member 112 is formed by press-working a grain-oriented magnetic steel sheet. The grain-oriented magnetic steel is also called a grain-oriented silicon steel sheet etc. and has an magnetization easy axis "A" in a certain direction thereof.

Each of the first core member 111 and the second core member 112 is formed into a substantially rectangular ring shape, which substantially has two short side portions and two long side portions. Each of the first core member 111 and the second core member 112 has a gap 130 at a center of one short side portion. The first core member 111 and the second core member 112 are formed to have the substantially same external shape.

The first core member 111 is cut out from the grain-oriented magnetic steel sheet so that the direction of the magnetization easy axis "A" of the first core member 111 is parallel to the side portion (long side portion) that is adjacent to the side portion (short side portion) having the gap 130. The second core member 112 is cut out from the grain-oriented magnetic steel sheet so that the direction of the magnetization easy axis "A" of the second core member 112 is parallel to the side portion (short side portion) having the gap 130.

The first core member 111 and the second core member 112 are stacked into a multilayer structure so that the location of the gap 130 of the first core member 111 matches that of the second core member 112. Accordingly, the first core member 111 and the second core member 112 have a multilayer structure in which the magnetization easy axis "A" of the first core member 111 and that of the second core member 112 are perpendicular to each other.

The first core member 111 has multiple first trap parts 141, 142, 143. The first trap part 141 is formed in the short side portion that is opposed to the other short side portion having the gap 130. The first trap parts 142, 143 are formed in the short side portion having the gap 130 so that the first trap parts 142, 143 are respectively formed in end parts of the short side portion having the gap 130. In FIG. 3A, the first trap parts 142, 143 are located on opposite sides of the gap 130. The first trap parts 141, 142, 143 suppresses the inflow of magnetic flux in a direction parallel to the short side portion of the first core member 111, that is, in a direction perpendicular to the magnetization easy axis "A" of the first core member 111.

The second core member 112 has multiple second trap parts 151, 152, 153, 154. The second trap parts 151, 152 are formed approximately at ends of one long side portion adjacent to the short side portion having the gap 130. The second trap parts 153, 153 are formed approximately at ends of the other long side portion adjacent to the short side portion having the gap 130. The second trap parts 151 to 154 suppresses the inflow of magnetic flux in a direction of the long side portion of the second core member 112, that is, in the side portion perpendicular to the magnetization easy axis "A" of the second core member 112.

For example, the core 110 may be constructed so that the multiple first core members 111 and the multiple second core members 112 are alternately stacked into an eleven-layer structure. In the above, the first core member 111 and the second core member 112 are arranged so that, at a corner of the core 110, a side portion (long side portion) of the first core member 111 extending in the direction of the magnetization easy axis "A" overlaps a side portion (short side portion) of the second core member 112 extending in the direction of the magnetization easy axis "A". At the corner of the core 110, the magnetic flux flowing in the first core member 111 is restricted, due to the first trap parts 141, 142, 143, from flowing in the direction perpendicular to the magnetization easy axis "A" of the first core member 111. At the corner of the core 110, the magnetic flux flowing in the second core member 112 is restricted, due to the second trap parts 151 to 153, from flowing in the direction perpendicular to the magnetization easy axis "A" of the second core member 112.

FIGS. 4A to 4C are diagrams for explanation on a magnetic path formed in the core 110.

In FIGS. 4A to 4C, the contrasting density graphically represents a difference in magnetic permeability. The high contrasting density represents a portion with a small magnetic permeability. The low contrasting density represents a portion with a large magnetic permeability.

The first core member 111 is processed so that: the core member 111 has a magnetization easy axis "A" in a long side direction of the first core member 111 (i.e., a direction of the long side portion of the first core member 111); and a short side direction (i.e., a direction of the short side portion) is perpendicular to the magnetization easy axis "A". Accordingly, the first core member 111 has a large magnetic permeability in the long side direction thereof, and has a small magnetic permeability in the short side direction thereof.

In contrast, the second core member 112 is processed so that: the second core member 112 has a magnetization easy axis "A" in a short side direction of the second core member 112 (i.e., a direction of the short side portion of the second core member 112); and a long side direction (i.e., a direction of the long side portion) is perpendicular to the magnetization easy axis "A". Accordingly, the core member 111 has a small magnetic permeability in the long side direction thereof, and has a large magnetic permeability in the short side direction thereof.

The core member 111 and the second member 112 are stacked with each other.

FIG. 4C illustrates the stacked core members 111, 112 that are, for explanation purpose, rolled out in the anticlockwise direction.

When the magnetic permeability for the magnetic flux in the anticlockwise direction is compared between the core member 111 and the core member 112 at the point "a", the magnetic permeability of the core member 112 is predominantly larger than that of the core member 111, and thus, all of the magnetic flux passes through the core member 112.

In an interval from the point "a" to the point "c", the magnetic permeability of the core member 112 is on the decrease while the magnetic permeability of the core member 111 is on the increase. At the point "b", the magnetic permeability of the first core member 111 and that of the second core member 112 are substantially equal to each other.

In the vicinity of the point "b", the magnetic flux is uniformly distributed in the first core member 111 and the second core member 112. As closer to the point "c", the magnetic permeability of the core member 111 is larger. As a result, in an interval between the point "c" and the point "d", the magnetic flux is moved from the core member 111 to the core member 112.

After the magnetic flux has passed through the point "d", the magnetic flux passes through an interval between the point "d" and the point "e". In the interval from the point "d" to the point "e", the magnetic permeability of the core member 111 decreases, and the magnetic permeability of the core member 112 increases. As a result, the magnetic flux is moved from the core member 111 to the core member 112.

In an interval between the point "f" and the point "g", all of the magnetic flux is moved into the core member 112. In a similar way, the magnetic flux is moved in an interval between the point "g" and the point "i" and in an interval between the point "k" and the point "n".

As can be seen from the above, the magnetic flux generated by a measurement target current passes through a magnetization easy axis portion (i.e., a portion that extends in the direction of the magnetization easy axis "A" and that allows the magnetic flux to flow in the direction of the magnetization easy axis "A") of the core members 111, 112 but does not flow in a portion perpendicular to the magnetization easy axis portion. Moreover, the core 110 can form or act as a magnetic circuit in which magnetic flux is moved between the core member 111 and the core member 112 at four corners of the core 110. That is, the core 110 can form or act as a magnetic circuit that selectively uses a portion having the favorable magnetic prosperity.

It may be ideal that the core member 111 and the core member 112 are assembled to firmly stick with each other. If a tiny clearance exists between the core member 111 and the core member 112, the tiny clearance can act as resistance for the magnetic flux to move between the core members 111 and 112. This is because the magnetic permeability of clearance is substantially equal to that of vacuum. The magnetic permeability is in general larger with increasing clearance. Since the clearance can make the movement of magnetic flux movement difficult, the magnetic saturation property influencing maximum measurement current and the coercivity force influencing hysteresis may be degraded.

In view of the above, a through hole acting as a trap part is provided in a portion of the first core member 111 extending in the direction perpendicular to the magnetization easy axis "A" of the first core member 111. Further, a through hole acting as a trap part is provided in a portion of the second core member 112 extending in a direction perpendicular to the magnetization easy axis "A" of the second core member 112. Thereby, a cross sectional area of the portion extending in the direction perpendicular to the magnetization easy axis "A" is increased. As a result, the magnetic flux is prevented from flowing into this portion (e.g., an interval between the point "c" and the point "d" in the second core member 112). Through the above manner, the movement of magnetic flux between the core members is ensured, and the magnetic saturation property and the coercivity are improved.

The magnetic flux flows in the core 110 in such way that the magnetic flux flows in the long side portions of the first core member 111 adjacent to the short side portion having the gap 130, and the magnetic flux flows in the short side portions of the second core member 112. In the above, the short side portions of the second core member 112 is one short side portion having the gap 130 and the other short side portion opposed to the short side portion having the gap 130.

In the present embodiment, the short side portions of the first core member 111 are portions that do not extend in the direction of the magnetization easy axis "A" of the first core member 111. The first trap parts 141 to 143 suppresses the supply of magnetic flux to the short side portions of the first core member 111 while promoting the supply of magnetic flux to the short side portions of the second core combers 112. The long side portions of the second core member 112 are portions that do not extend in the direction of the magnetization easy axis "A" of the second core member 112. The second trap parts 151 to 154 suppresses the supply of magnetic flux to the long side portions of the second core member 112 while promoting the supply of magnetic flux to the long side portions of the first core combers 111. At a corner part of the core 110, a side portion (e.g., long side portion) of the first core member 111 extending in the direction of the magnetization easy axis "A" overlaps a side portion (e.g., short side portion) of the second core member 112 extending in the direction of the magnetization easy axis "A". At the corner part of the core 110, because of the first trap parts 141 to 143 and the second trap parts 151 to 154, the magnetic flux flows in the thickness direction of the first core member 111 and the second core member 112. Then, the magnetic flux is supplied to the side portion of the first or second core member 111, 112 extending in the direction of the magnetization easy axis "A".

According to the above manners, it is possible to improve magnetic flux flow and reduce error.

A manufacturing method of a core 110 of the present embodiment will be described below.

FIGS. 5 to 12 are diagrams illustrating manufacturing processes of the core 110.

A grain-oriented magnetic steel sheet having a stripe shape and having a magnetization easy axis "A" in an extension direction of the stripe shape is press-worked. In the grain-oriented magnetic steel sheet, a first region "a1" and a second region "a" are alternately arranged. In the first region "a1", the first core member 111 is to be formed. In the second region "a2", the second core member 112 is to be formed.

The first trap parts 141 to 143, a center hole part 144, the gap 130, and an attachment part 145 are formed in the first region "a1".

Figure 5:
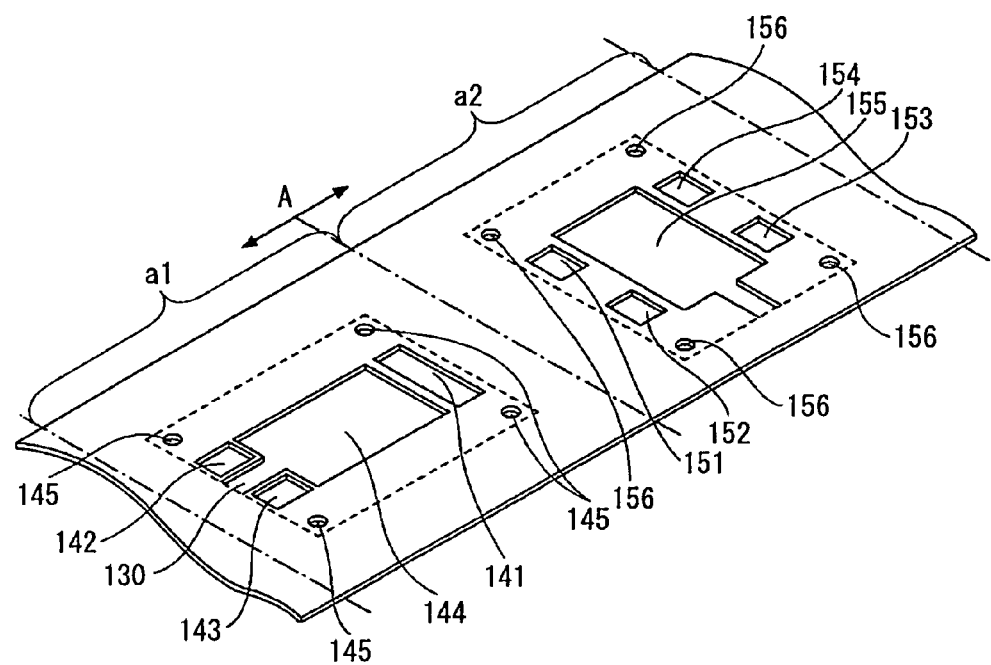
FIGS. 5 to 12 are diagrams illustrating manufacturing processes of a core according to one embodiment.

As shown in FIG. 5, the first core member 111 is formed in the first region "a1" so that the extension direction of the long side portions of the first core member 111 is parallel to the magnetization easy axis of the grain-oriented magnetic steel. The attachment parts 145 are formed at four corners of the first core member 111 so that each attachment part 145 is concave on a front surface of the first core member 111 and convex on a rear surface of the first core member 111. The concave shape of the attachment part 145 on the front surface is engagable with the convex shape of the attachment part 145 on the rear surface.

The second trap parts 151 to 154, a center hole part 155, the gap 130 and an attachments part 156 are formed in the region "a2".

As shown in FIG. 5, the second core member 112 is formed in the second region "a2" so that the extension direction of the short side portions of the second core member 112 is parallel to the magnetization easy axis of the grain-oriented magnetic steel.

Thus, as shown in FIG. 5, the first core member 111 and the second core member 112 are formed to have a positional relation in which the first and second core members 111, 112 are rotated relative to each other by 90 degrees on the grain-oriented magnetic steel sheet.

Like the attachment parts 145 of the first core member 111, the attachment parts 156 are formed at four corners of the second core member 112 so that: each attachment part 156 has a concave shape on a front surface and a convex shape on a rear surface; and the attachment parts 156 respectively correspond in location to the attachment parts 145. Each attachment part 156 is formed so that the concave shape on the front surface and the convex shape on the rear surface are engagable with each other.

Figure 6:
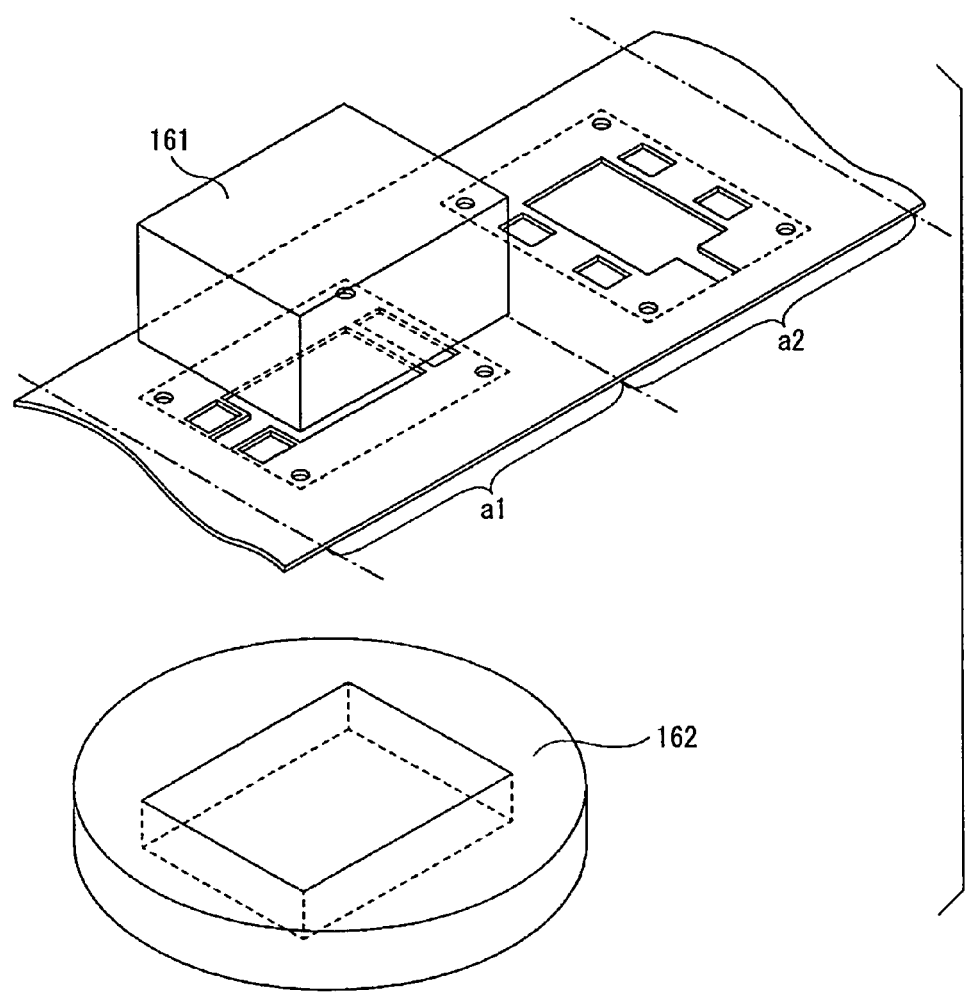
Figure 7:
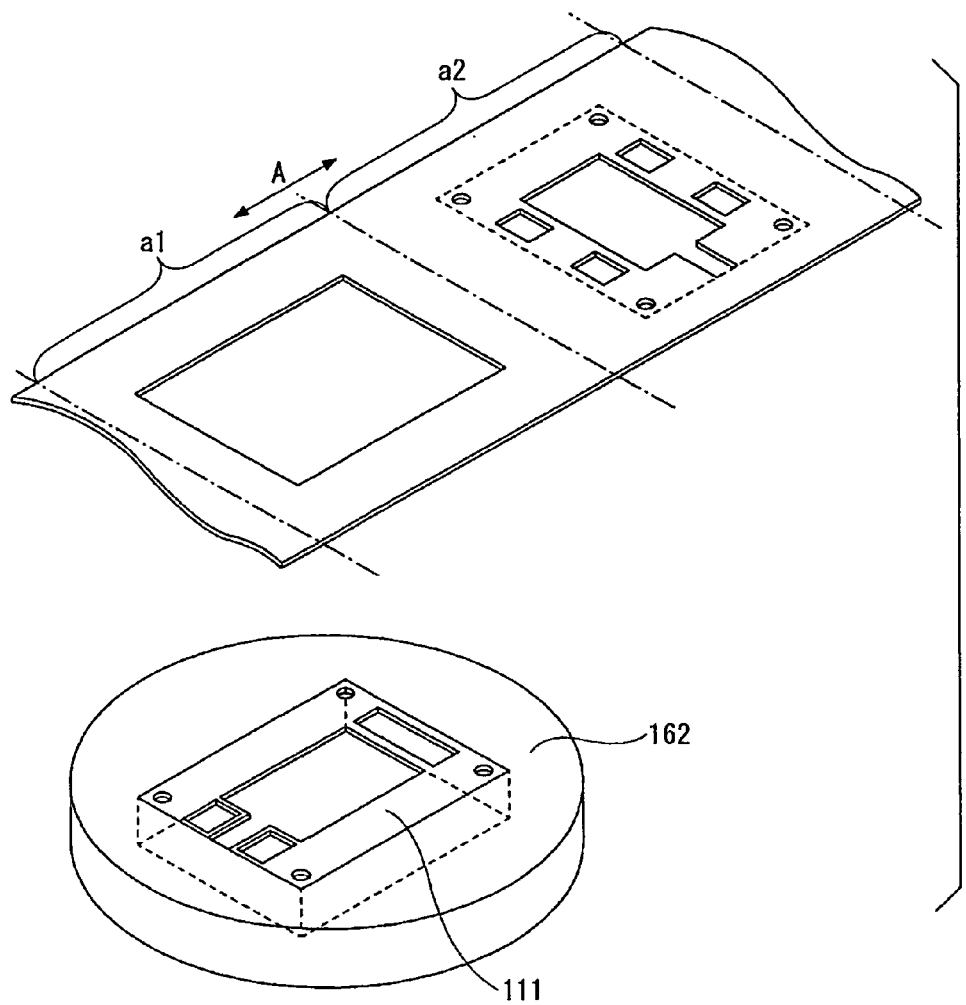

Then, as shown in FIG. 6, the region "a1" is placed between an upper mold 161 and a lower mold 162. The region "a1" of the grain-oriented magnetic steel sheet is pressed by the upper mold 161 and the lower mold 162, and the first core member 111 is cut out and in the lower mold 162, as shown in FIG. 7.

Figure 8:
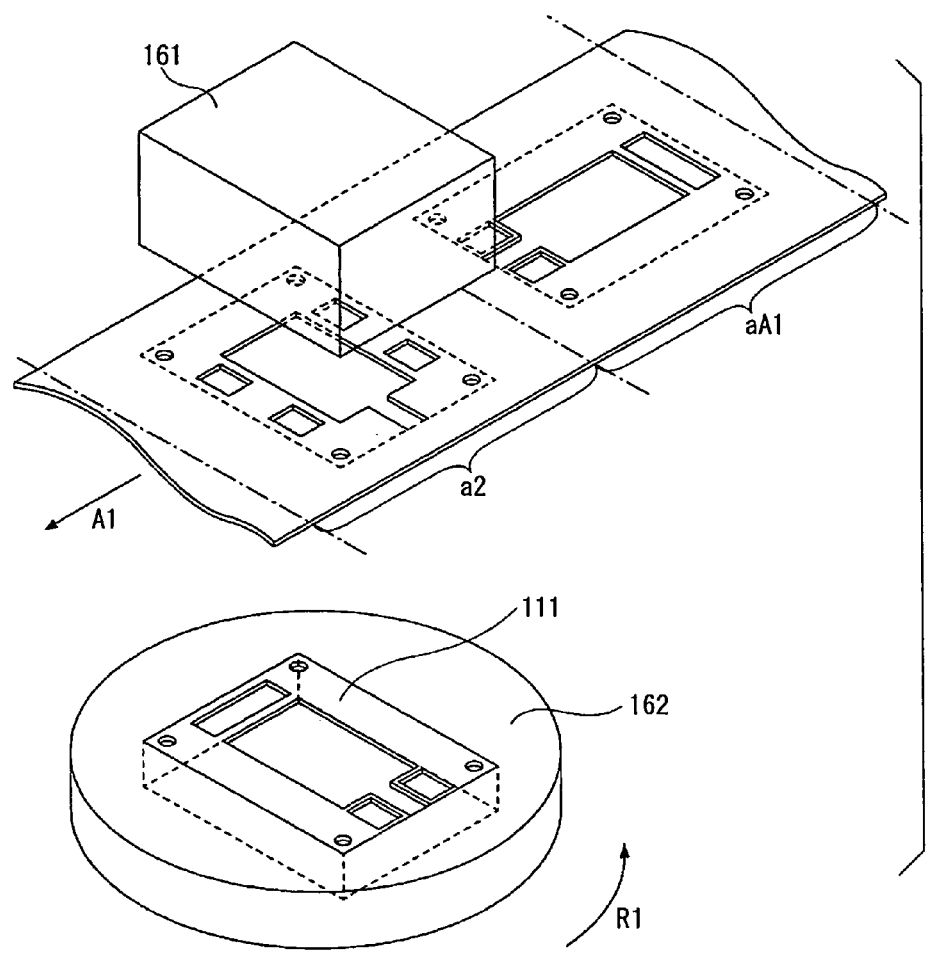

Then, as shown in FIG. 8, the grain-oriented magnetic steel sheet is displaced in a direction of the arrow "A1", so that the region "a" is positioned between the upper mold 161 and the lower mold 162. In addition, the upper mold 161 and the lower mold 162 are rotated by 90 degrees in a direction of the arrow "R1". In the above, a handling mechanism 163 displaces the grain-oriented magnetic steel sheet. The handing mechanism 163 includes, for example, a motor and a transport mechanism. The transport mechanism of the handling mechanism 163 is engaged with the grain-oriented magnetic steel sheet, and displaces the grain-oriented magnetic steel sheet in the direction of the arrow "A1" using the rotation of the motor.

The upper mold 161 and the lower mold 162 are rotated by a rotation mechanism 164. The rotation mechanism 164 includes a motor and a speed reducer gear mechanism. The upper mold 161 and the lower mold 162 gear with the speed reducer gear mechanism via a frame or the like, and configured so that the rotation of the motor causes the rotation of the speed reducer gear mechanism, which causes the rotation of the upper mold 161 and the lower mold 162 by 90 degrees.

Figure 9:
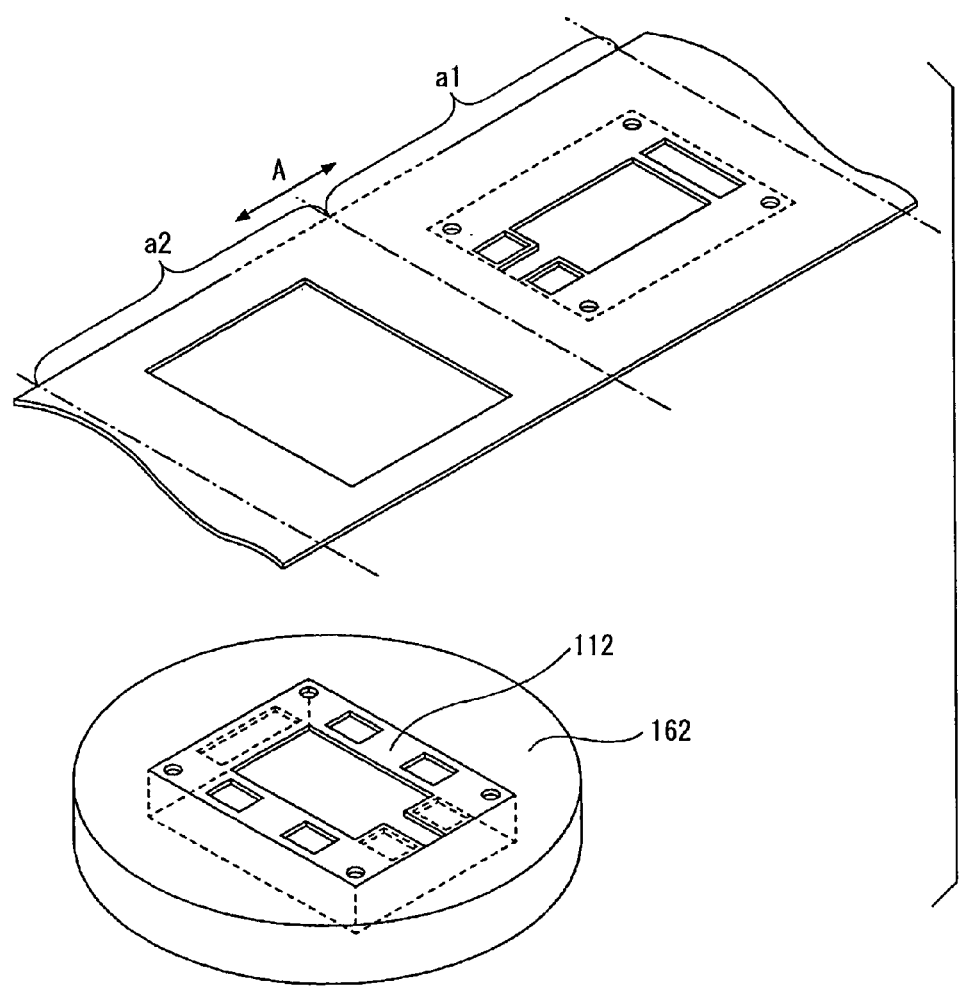

The region "a2" of the grain-oriented magnetic steel sheet is pressed by the upper mold 161 and the lower mold 162. Thereby, as shown in FIG. 9, the second core member 112 is cut out and in the lower mold 162. In the above, the second core member 112 pushes the previously-cut-out first core member 111 into the lower mold 162.

When the first core member 111 is push into by the second core member 112, the convex part of the attachment part 156 on the lower surface of the second member 112 is press-fitted into the concave part of the attachment part 145 on the upper surface of the first core member 111, and the first core member 111 and the second core member 112 are connected to each other.

In the above, because of the rotation of the upper mold 161 and the lower mold 162 by 90 degrees, the first core member 111 and the second core member 112 are connected to each other so that the magnetization easy axis "A" of the first core member 111 and that of the second core member 112 are perpendicular to each other.

Then, the grain-oriented magnetic steel sheet is displaced in the direction of the arrow "A1". The region "a1" is placed between the upper mold 161 and the lower mold 162. The upper mold 161 and the lower mold 162 are rotated by 90 degrees in the direction of the arrow "R2". The region "a1" is press-worked by the upper mold 161 and the lower mold 162; thereby, the first core member 111 is cut out and in the lower mold 162. The cut-out first core member 111 is stacked on the second core member 112.

Figure 10:
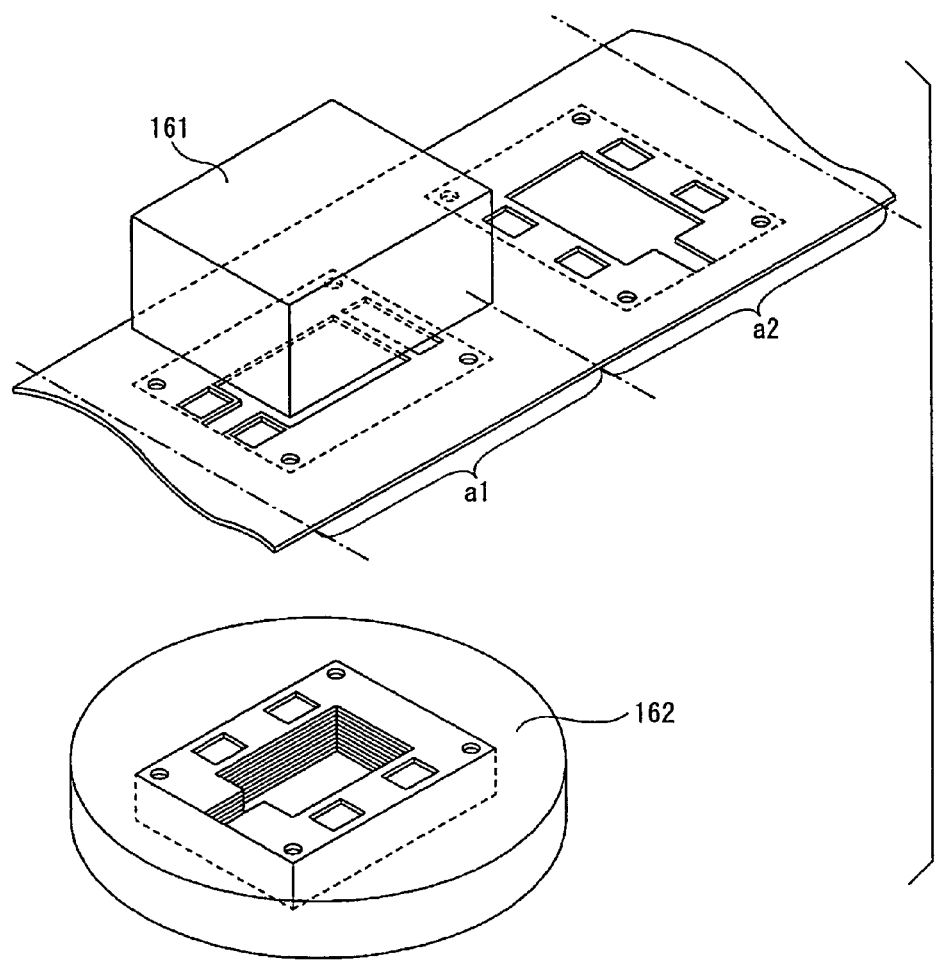
Figure 11:
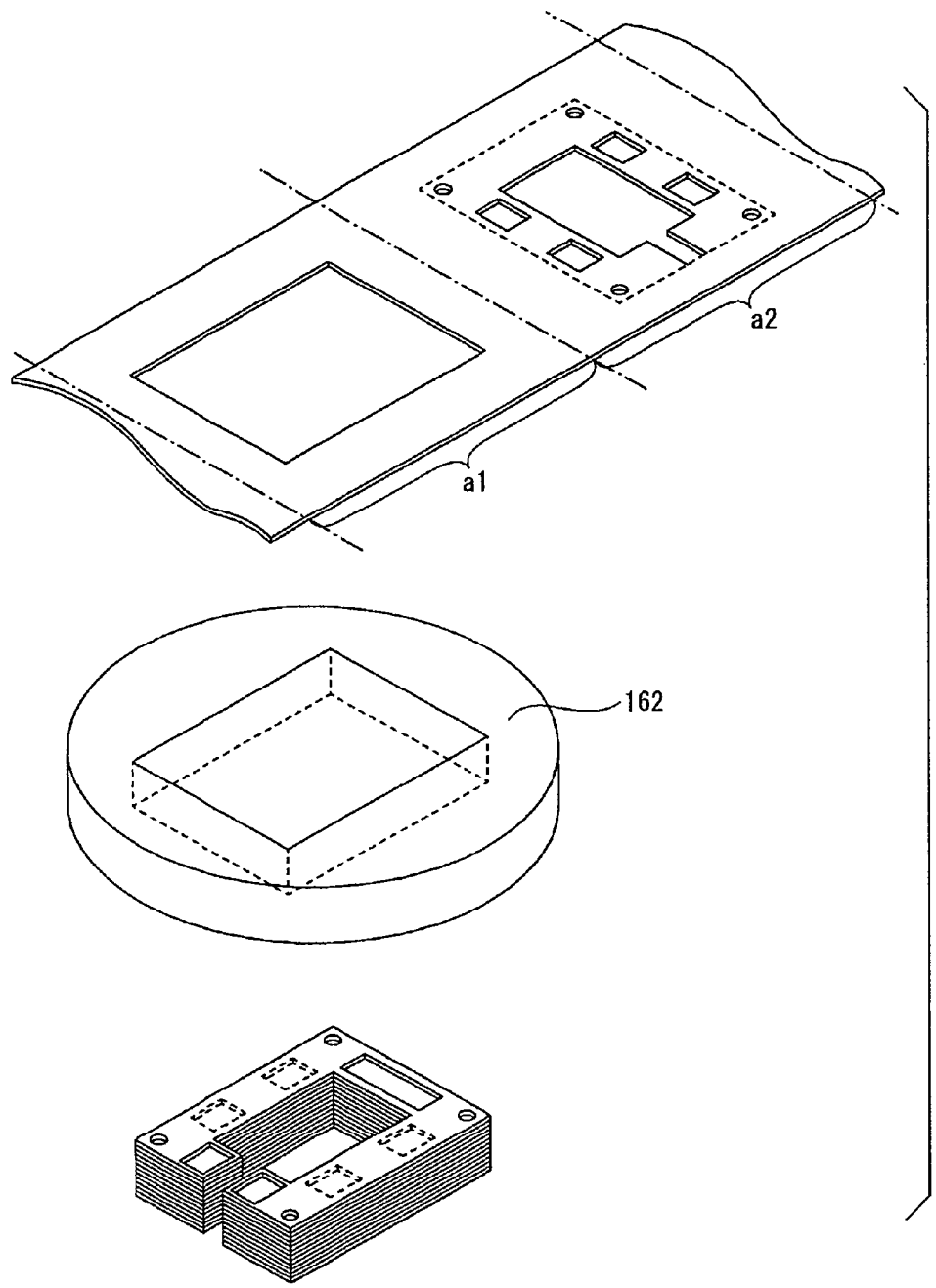

The above processes are repeated. As a result, the first core members 111 and the second core members 112 are alternately stacked in the lower mold 162, as shown in FIG. 10. As shown in FIG. 10, the positioning of region "a1" is performed so that the region "a1" is between the upper mold 161 and the lower mold 162. As shown in FIG. 11, the first core member 111 is cut out and pressed into the lower mold 162. The stacked first and second core members 111, 112 are removed from the lower mold 162. Through the above processes, the core 110 is manufactured.

Figure 12:
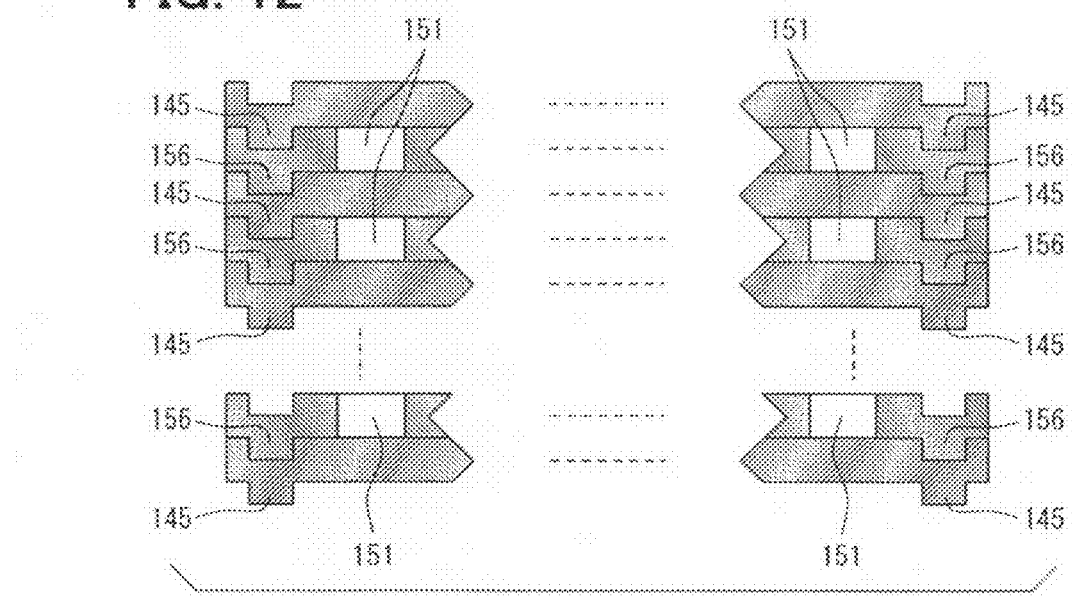

FIG. 12 is a sectional view of the core 110.

As shown in FIG. 12, the attachment parts 145, 156 are connected to each other when the first core member 112 and the second core member 112 are cut out and pressed. Thereby, the stacked first and second core members 111, 112 are bonded to each other. According to this way, the stacking is performed at the same time the press-working is performed. Thus, it is possible to improve manufacturing efficiency.

Explanation will be given below on unpredictable advantages of the present embodiment.

Figure 13:
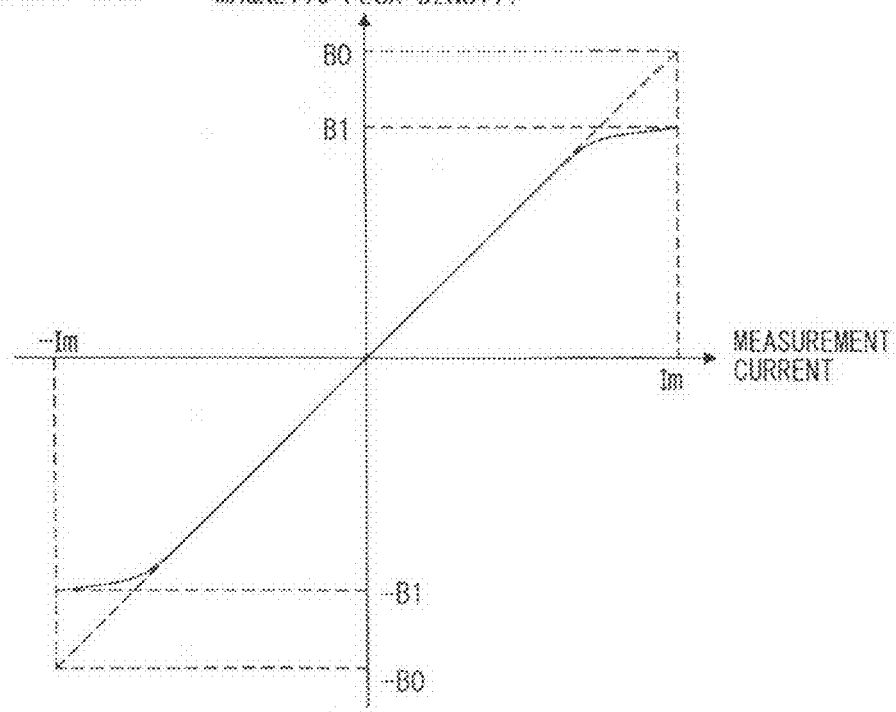
FIG. 13 is a diagram illustrating a magnetic property according to one embodiment.
Figures 14, 15:
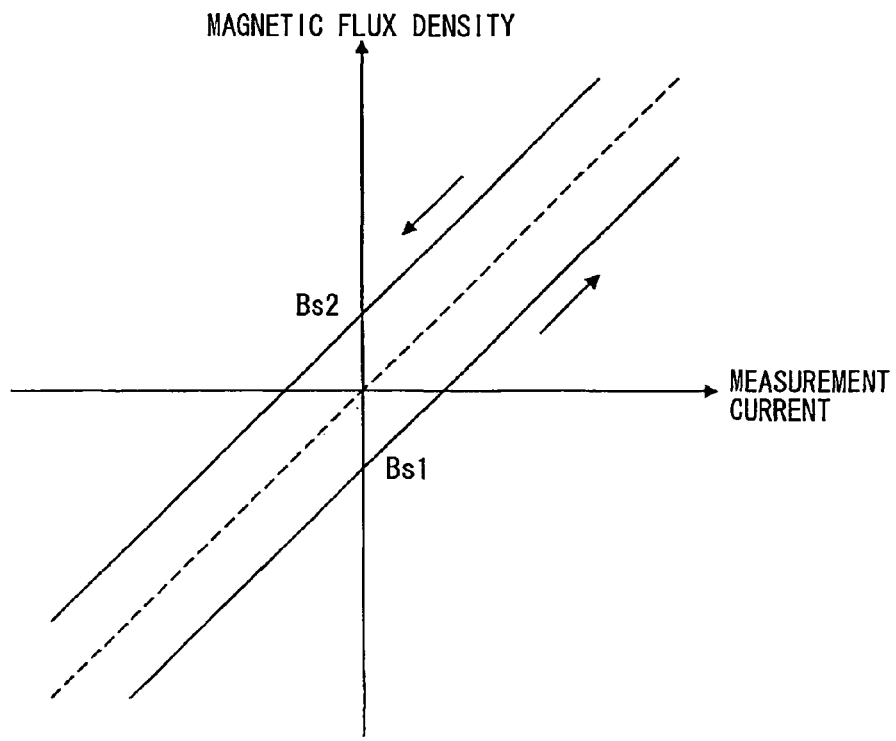
FIG. 14 is a diagram illustrating the magnetic property in the vicinity of zero point of FIG. 13.
FIG. 15 is a diagram illustrating a property of output voltage with respect to input current according to one embodiment.

FIGS. 13 and 14 are diagrams for explanation on magnetic properties of the current sensing device of one embodiment. More specifically, FIG. 13 illustrates a property of magnetic flux density as a function of a measured current. FIG. 14 illustrates the property of the magnetic flux density in the vicinity of zero point by enlarging FIG. 13.

In FIG. 13, the solid line shows the magnetic flux density as a function of the current measured at a gap part of the core 110. The dashed line shows the magnetic flux density as a function of current to be measured in an ideal case.

A line representing a relationship between the magnetic flux density and the current to be measured is preferably a straight line passing through the zero point, as shown in FIG. 13. However, a line representing the actual relationship is curved due to magnetic saturation of core members. Here, a maximum measurement current is defined as a current value at which magnetic flux density $B1$ is 0.99 times as large as an ideal magnetic flux density $B0$ (i.e., $B1=0.99 \times B0$).

FIG. 15 is a diagram illustrating a result of evaluation of core quality (positive or negative) using the maximum measurement current and hysteresis width.

In FIG. 15, the term "WITH TRAP" is for the properties of the core 110 in which the first core member 111 having the first trap parts 141 to 143 and the second core member 112 having the second trap parts 151 to 154 are alternately stacked into a multilayer structure. In FIG. 15, the term "WITHOUT TRAP" is for the properties of a core in which a first core member 111 not having the first trap parts 141 to 143 and a second core member 112 not having the second trap parts 151 to 154 are alternately stacked into a multilayer structure. The core 110 "WITH TRAP" and the core "WITHOUT TRAP" are the same except the presence and absence of trap parts, i.e., are the same in material, external shape, processing method, heat treatment method and the like.

When the maximum measurement current is compared between the core 110 with trap parts and the core without trap parts in FIG. 15, the core 110 with trap parts has a maximum measurement current of 338.1 A and the core without trap parts has a maximum measurement current of 322.9 A. The core 110 with trap parts has a 5% advantage over the core without trap parts.

Regarding the hysteresis width, the core 110 with trap parts has a hysteresis width of 0.129 mT (corresponding to 0.25 A) and the core without trap parts has a hysteresis width of 0.109 mT (corresponding to 0.218 A). The hysteresis width of each of the core 110 with trap parts and the core without the tarp parts is negligible as compared to the maximum measurement current. There is no significant difference in the hysteresis between the core 110 with trap parts and the core without trap parts.

According to the present embodiment, the core 110 is configured as follows. Each of the first core member 111 and the second core member 112 is made of a grain-oriented magnetic steel sheet, which has a magnetization easy axis in a predetermined direction thereof. The first and second core members 111, 112 are alternately stacked into a multilayer structure so that the direction of the magnetization easy of the first core member 111 and that of the second core member 112 are perpendicular to each other. The first core member 111 has the first trap parts 141 to 143, which suppresses the inflow of magnetic flux in the first core member 111 in the direction perpendicular to the magnetization easy axis "A" of the first core member 111. The second core member 112 has the second trap parts 151 to 154, which suppresses the inflow of magnetic flux in the second core member 112 in the direction perpendicular to the magnetization easy axis "A" of the second core member 112. According to the above structure, it is possible to suppress the inflow of magnetic flux in the direction perpendicular to the magnetization easy axis "A", and it is possible to constitute a magnetic circuit whose magnetic property is improved due to the first core member 111 and the second core member 112. Therefore, it is possible to improve the magnetic property of a core as a whole.

In the above-described example, shape of the first trap parts 141 to 143 and the second trap parts 151 to 154 is quadrilateral. Alternatively, the shape may be circular etc.

Figure 16:
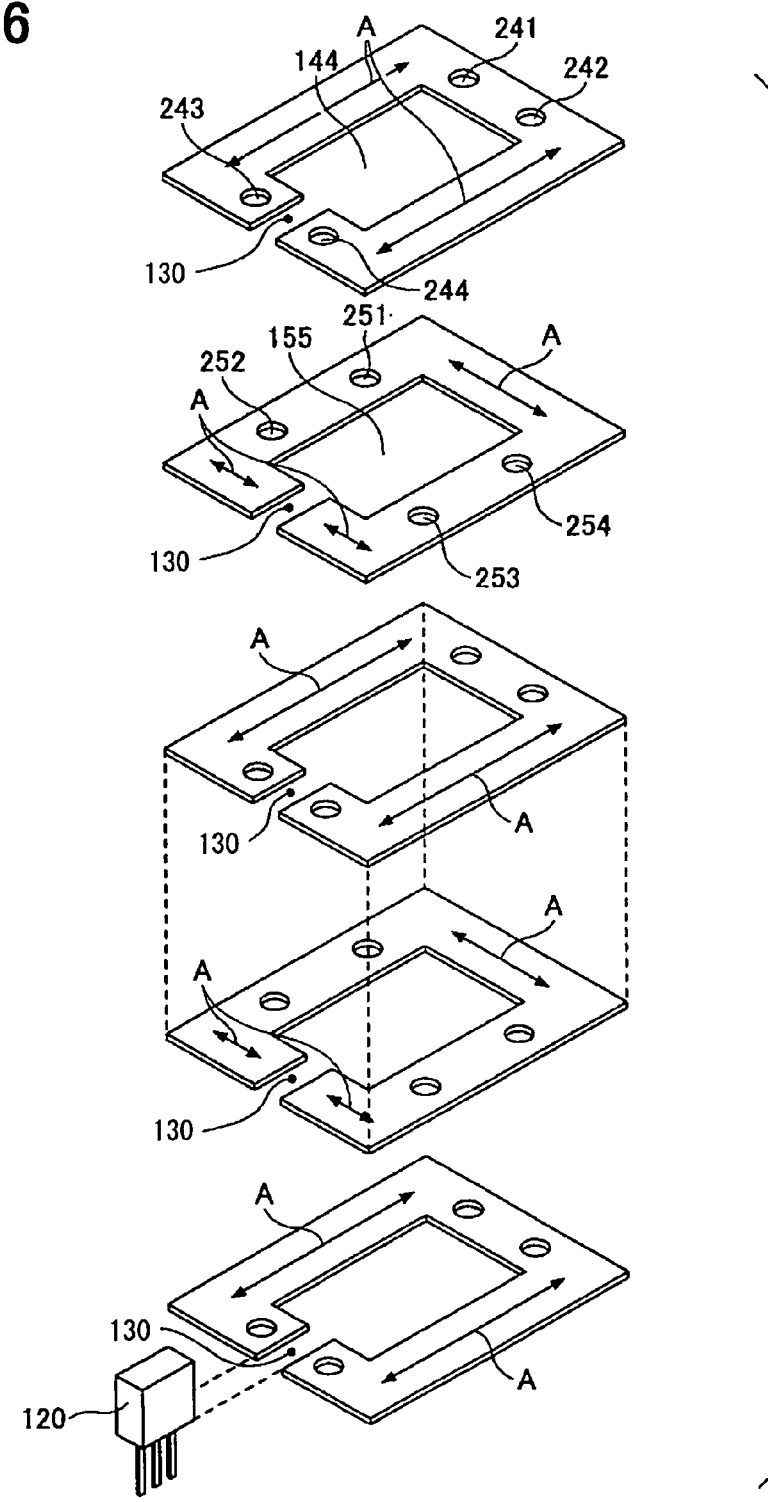
FIG. 16 is a exploded perspective view of a current sensing device according to a first modification of one embodiment.
Figure 17:
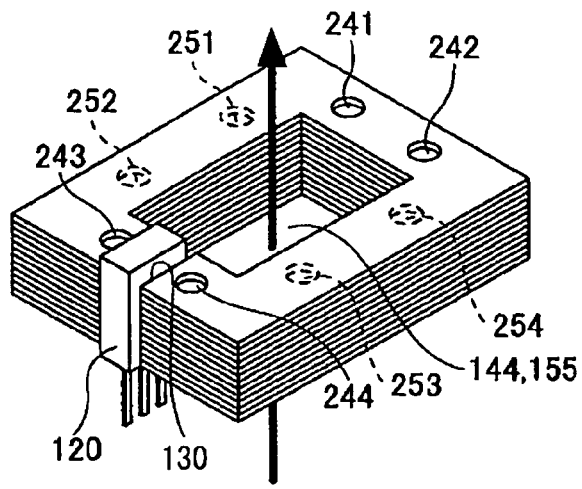
FIG. 17 is a perspective view of an assembled current sensing device according to the first modification of one embodiment.
Figure 18A:
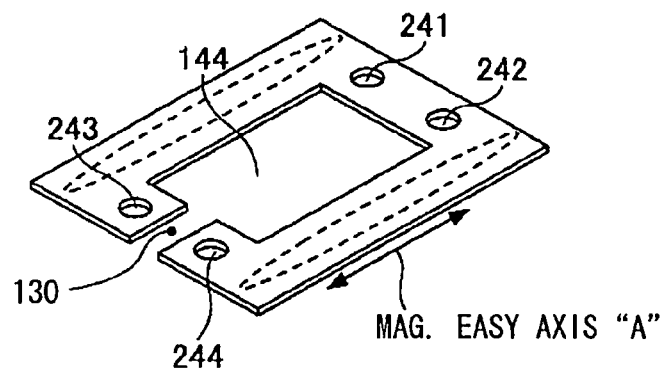
FIGS. 18A and 18B are respectively perspective views of a first core member and a second core member according to the first modification of one embodiment.
Figure 18B:
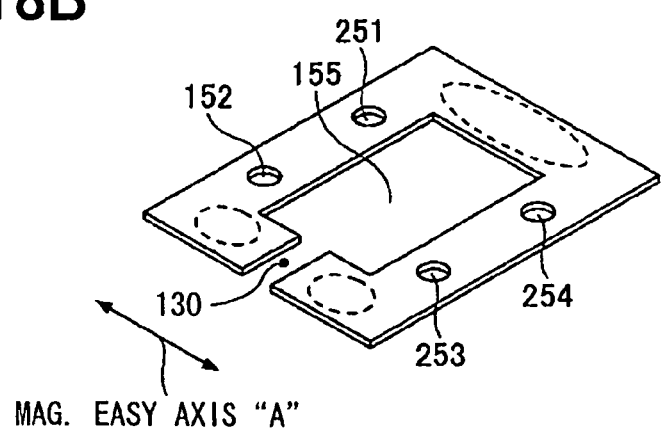

FIG. 16 is an exploded perspective view of a current sensing device 200 according to a first modification example of one embodiment. FIG. 17 is a diagram illustrating the assembled current sensing device 200 according to the first modification example of one embodiment. FIG. 18A and FIG. 18B are respectively perspective views of a first core member 211 and a second core member 212 according to the first modification example of one embodiment. Like numerical references may be used to refer to like parts in FIGS. 1 to 3 and FIGS. 16 to 18. Thus, explanation on some of like parts may be omitted below.

In the first modification example, the shape of first trap parts 241 to 244 and second trap parts 251 to 254 is circular. Because of the circular shape of the first trap parts 241 to 244 and the second trap parts 251 to 254, it is possible to easily ensure strength and restrict an occurrence of deformation.

In the above-described example, the first trap parts 141 to 143, 241 to 244 and the second trap parts 151 to 154, 251 to 254 are through-holes but are not limited to through-holes. For example, the first trap parts 141 to 143, 241 to 244 and the second trap parts 151 to 154, 251 to 254 may be notches, or thin parts whose thickness is smaller than other parts of the core member 211, 212. In other words, the first trap parts 141 to 143, 241 to 244 may suffice as long as the first trap part 141 to 143, 241 to 244 has a shape or structure that can suppress the flow of magnetic flux into a portion of the first core member 111, 211 that extends in a direction perpendicular to the magnetization easy axis "A" of the first core member 111, 211. Similarly, the second trap parts 151 to 154, 251 to 254 may suffice as long as the second trap part 151 to 154, 251 to 254 has a shape or structure that can suppress the flow of magnetic flux into a portion of the second core member 112, 212 that extends in a direction perpendicular to the magnetization easy axis "A" of the second core member 112, 212.

In the present embodiment, portions having the first trap parts 141 to 143, 241 to 244 and the second trap parts 151 to 154, 251 to 253 are inevitably different in magnetic permeability from portions other than the portion having the first trap parts and the second trap parts. Therefore, the magnetic permeability is not the same all around the first core member 111, 211 and the second core member 112, 212.

Figure 19:
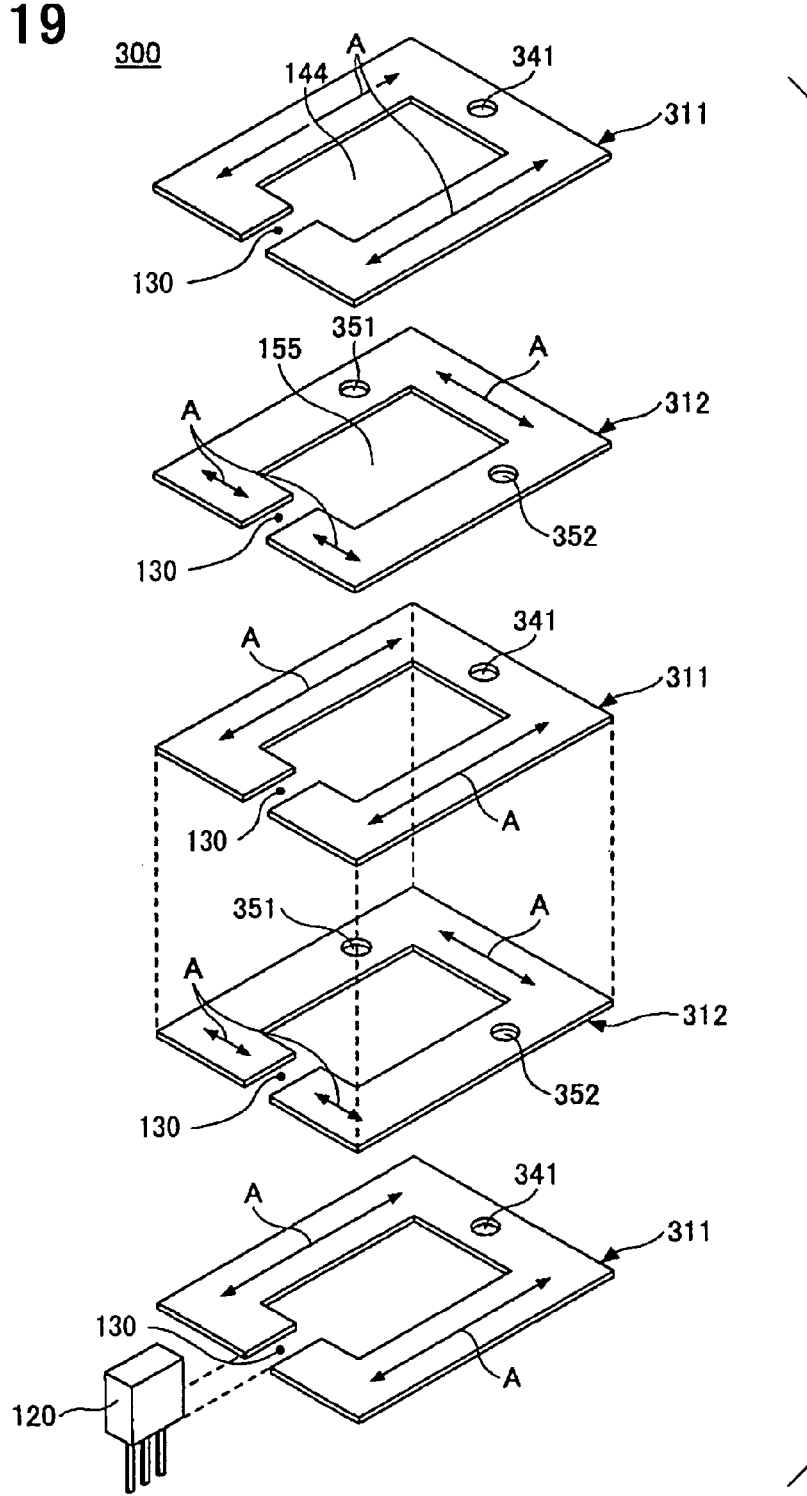
FIG. 19 is a exploded perspective view of a current sensing device according to a second modification of one embodiment.
Figure 20:
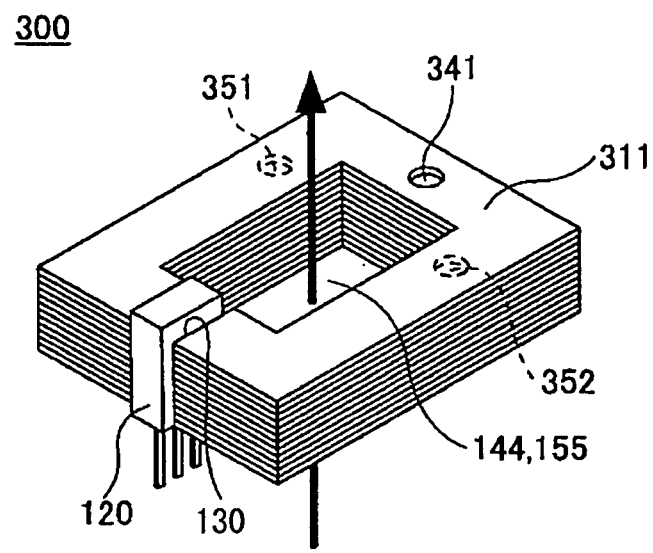
FIG. 20 is a perspective view of an assembled current sensing device according to the second modification of one embodiment.
Figure 21A:
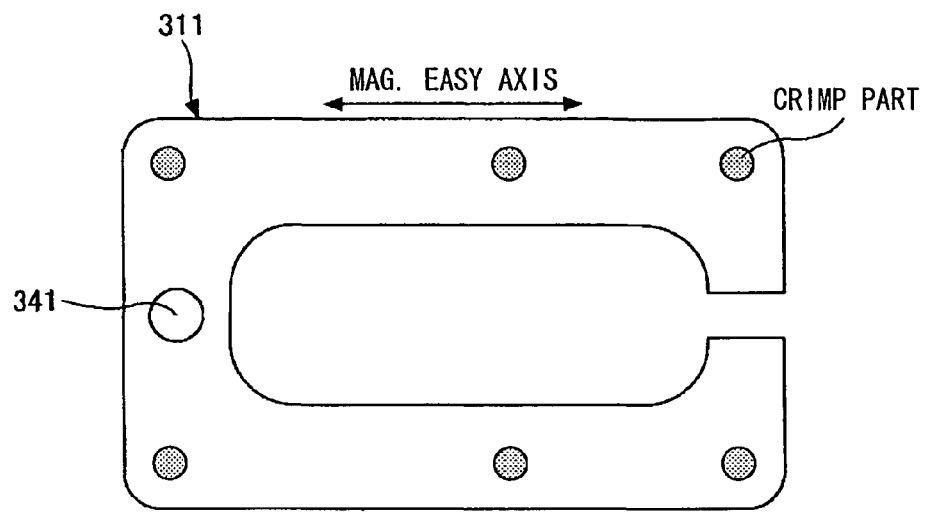
FIGS. 21A and 21B are respectively plan views of a first core member and a second core member according to the second modification of one embodiment.
Figure 21B:
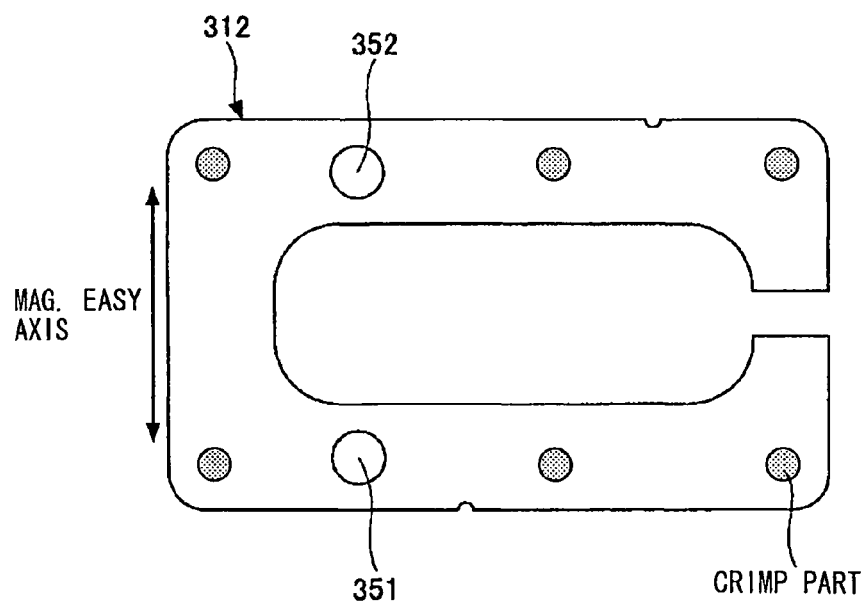

FIG. 19 is an exploded perspective view of a current sensing device 300 according to a second modification example of one embodiment. FIG. 20 is a diagram illustrating an assembled current sensing device 300 according to the second modification example of one embodiment. FIGS. 21A and 21B are diagrams respectively illustrating a first core member 311 and a second core member 312.

The current sensing device 300 of the second modification example includes a core 310, which is different in structure from the core 110 and the core 210. A material and an external shape of the first core member 311 of the second modification example are the same as the first core member 111, 211. A material and an external shape of the second core member 312 are also the same as the second core member 112, 212. However, a first trap part 341 of the first core member 311 is different in number, shape and location from that of the first core member 111, 211. A second trap part 352 of the second core member 312 is also different in number, shape and location from that of the second core member 112, 212. The first core member 311 and the second core member 312 may have crimp parts.

The first trap part 341 is formed in the first core member 311, and the second trap parts 351, 352 are formed in the second core member 312. Each of the first and second trap parts 341, 351, 352 is circular.

The second trap parts 351, 352 are respectively formed in the long side portions of the second core member 312 so that the second trap parts 351, 352 are located in vicinity of a short side portion that does not having the gap "G" and is opposed to the short side portion having the gap "G".

The first trap part 341 is formed in a short side portion of the first core member 311 so that the first trap part 351 is approximately located at a center of the short side portion that does not have the gap "G" and that is opposed to the short side portion having the gap "G".

In this modification example, the minimal number of trap parts, which are the first trap part 341 and the second trap parts 351, 352, are provided. Further, each trap part 341, 351, 352 is circular. Thereby, the strength can be easily ensured, and the deformation can be difficult to occur.

Figure 22A:
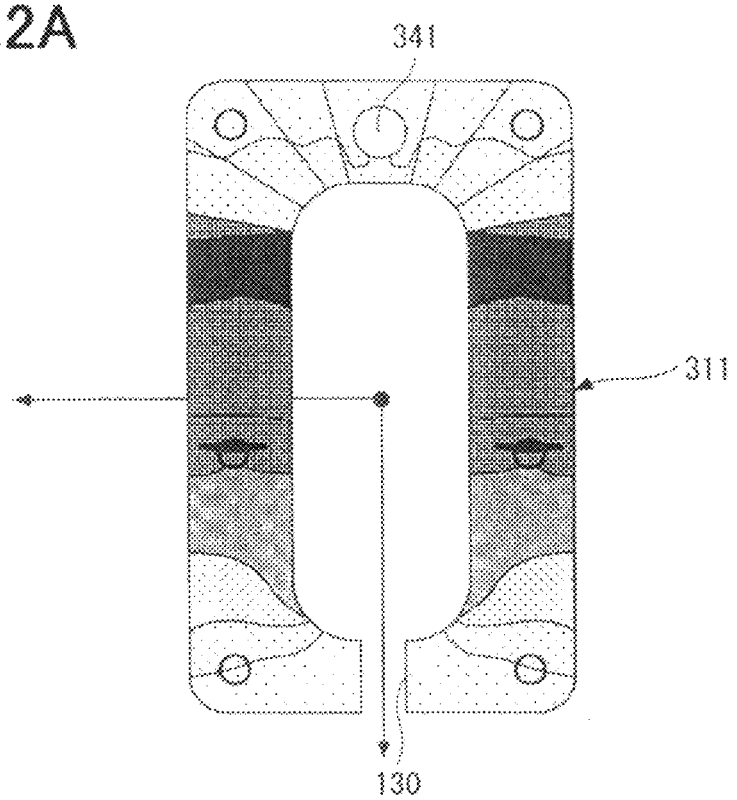
FIGS. 22A and 22B are respectively diagrams illustrating distribution of magnetic flux in a first core member and that in a second core member according to the second modification of one embodiment.
Figure 22B:
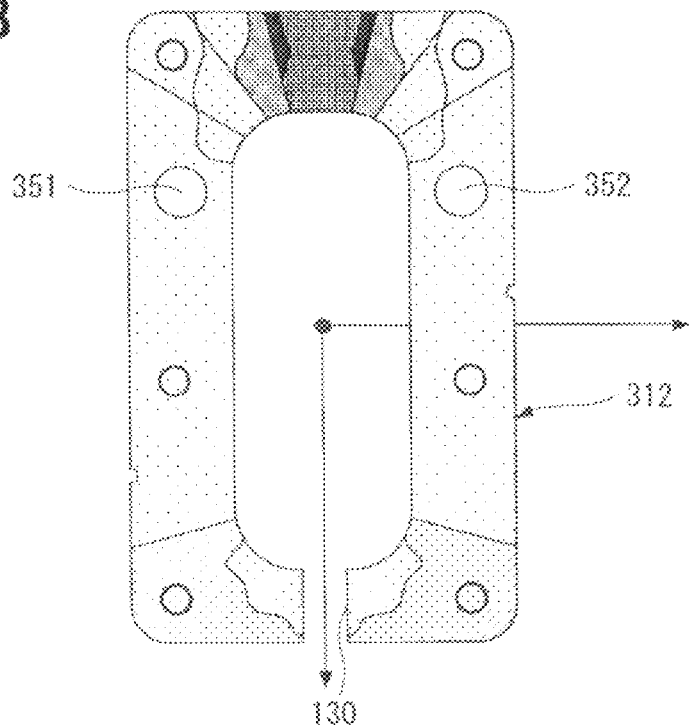
Figure 23:
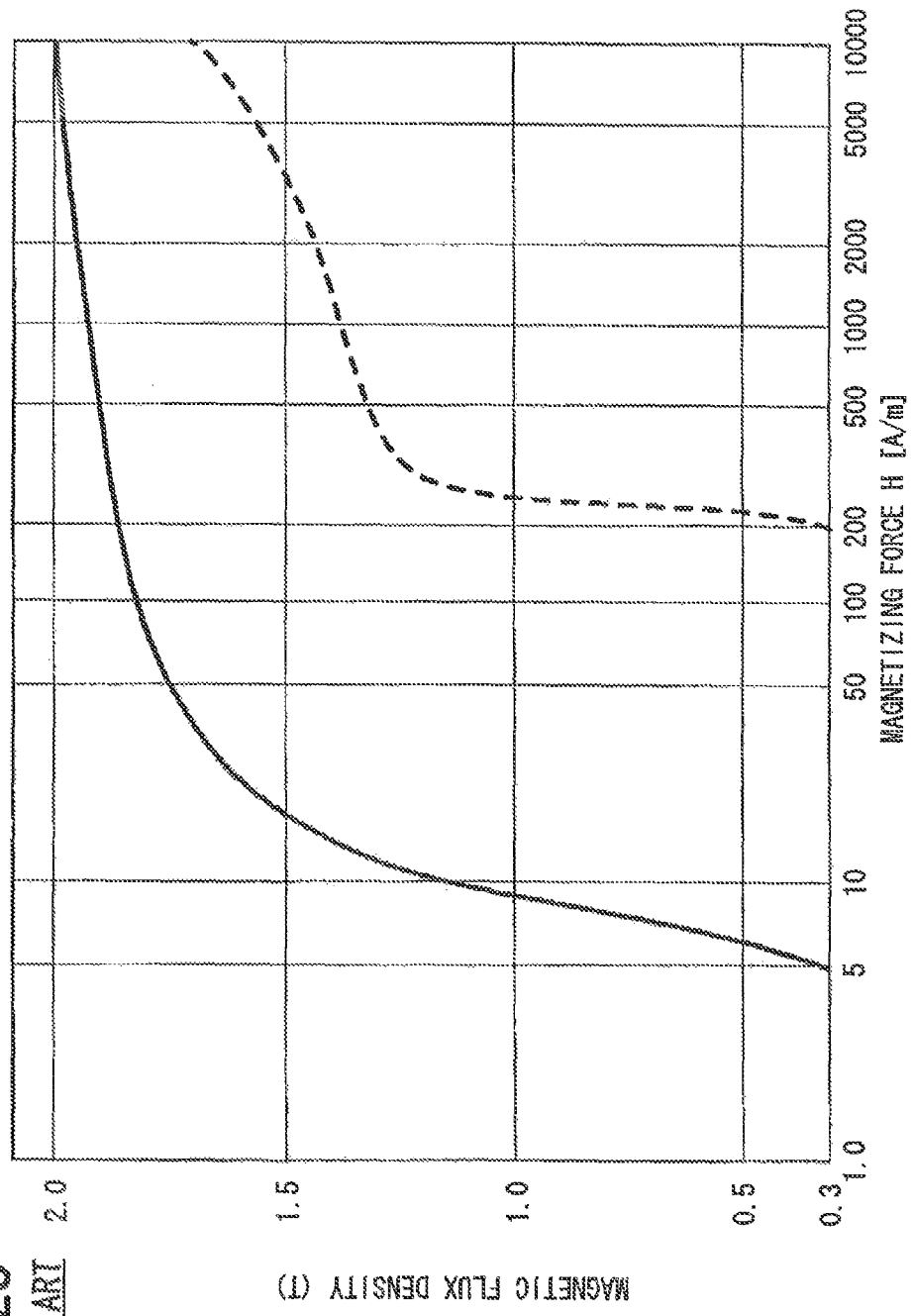
FIG. 23 is a diagram illustrating a relationship between magnetic flux density and coercivity of a grain-oriented magnetic steel sheet.
Figure 25A:
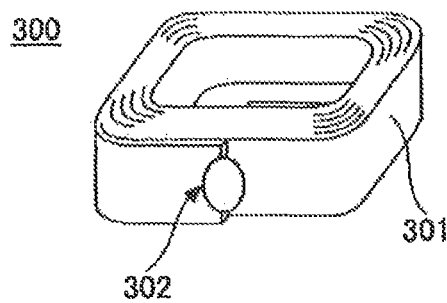
FIGS. 25A and 25B are diagrams illustrating one example of a core made with a grain-oriented magnetic steel sheet.
Figure 25B:
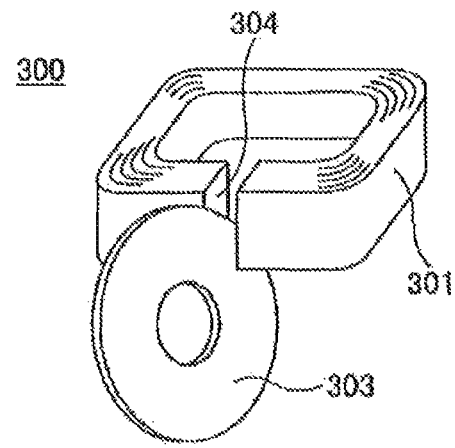
Figure 26:
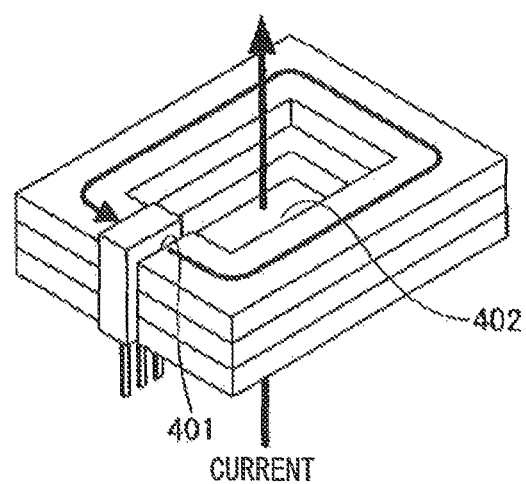
FIG. 26 is a diagram illustrating one example of a core made with permalloy.
Figure 27A:
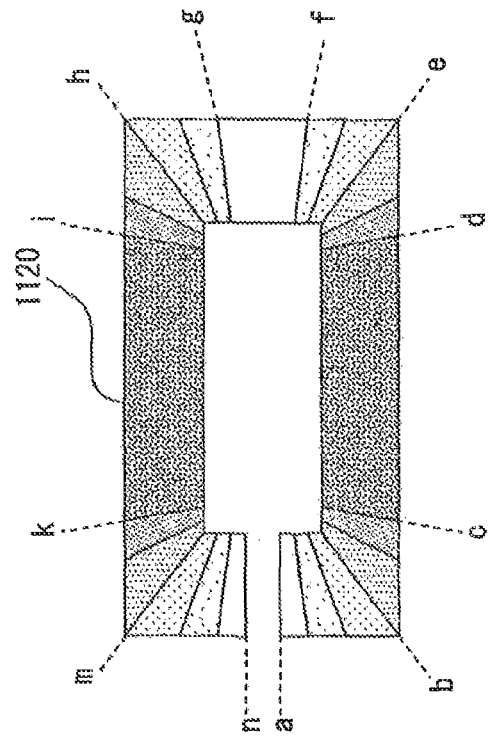
FIGS. 27A to 27C are diagram illustrating a magnetic path of a core having stacked grain-oriented magnetic steel sheets.
Figure 27B:
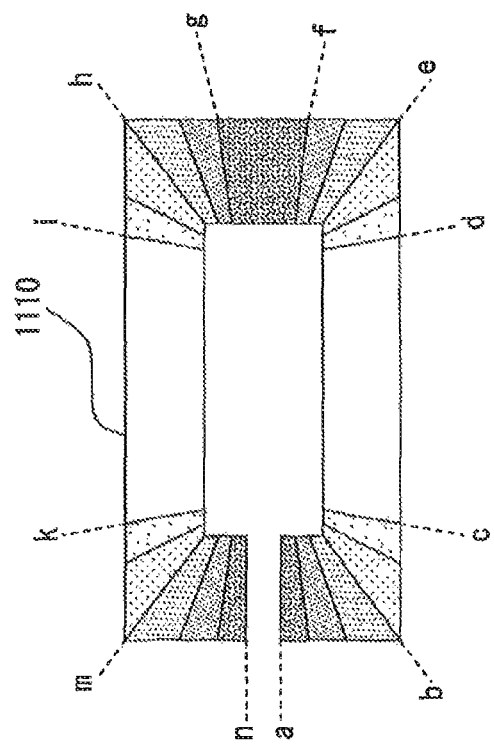
Figure 27C:
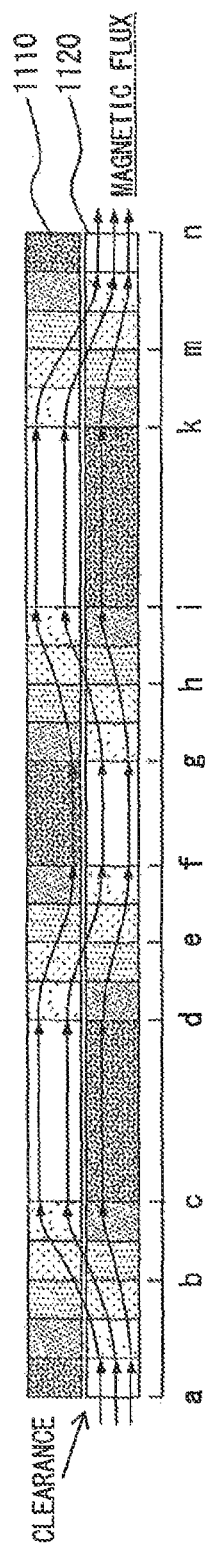

FIGS. 22A and 22B are diagrams respectively illustrating magnetic flux distribution in the first core member 311 and that in the second core member 312 by using contrasting density.

FIG. 22A and FIG. 22B illustrate the magnetic flux distribution in a case where the first core member 311 and the second core member 312 are stacked into a multilayer structure and a current of approximately 100 A flows through the center part of the first and second core members 311, 312. As shown in FIGS. 22A and 22B, an area surrounding the first trap part 341 and an area surrounding the second trap part 351 have small contrasting density and small magnetic flux density. FIGS. 22A and 22B show that the first trap part 341 and the second trap parts 351 work effectively.

In the above-described examples, the first trap parts 141 to 143, 241 to 244, 341 and the second trap parts 151 to 154, 251 to 254, 351, 352 are through-holes but are not limited to through-holes. For example, the first trap parts 141 to 143, 241 to 244, 341 and the second trap parts 151 to 154, 251 to 254, 351, 352 may be notches, or a thin part whose thickness is smaller than other parts of the core member 111, 112, 211, 212, 311, 312. In other words, the first trap parts 141 to 143, 241 to 244, 341 may suffice as long as the first trap part 141 to 143, 241 to 244, 341 has a shape or structure that can suppress the flow of magnetic flux into a portion of the first core member 111, 211, 311 that extends in a direction perpendicular to the magnetization easy axis "A" of the first core member 111, 211, 311. Similarly, the second trap parts 151 to 154, 251 to 254, 351, 352 may suffice as long as the second trap part 151 to 154, 251 to 254, 351, 352 has a shape or structure that can suppress the flow of magnetic flux into a portion of the second core member 112, 212, 312 that extends in a direction perpendicular to the magnetization easy axis "A" of the second core member 112, 212, 312. In the above-described examples, each of the first core member 111, 211, 212, 312 and the second core member 112, 212, 312 has a rectangular ring shape. Alternatively, each of the first core member 111, 211, 212, 312 and the second core member 112, 212; 312 may be another shape In the above embodiments, portions having the first trap parts 141 to 143, 241 to 244, 341 and the second trap parts 151 to 154, 251 to 253, 351, 352 are inevitably different in magnetic permeability from portions other than the portions having the first trap parts and the second trap parts. Therefore, the magnetic permeability is not the same all around each of the first core member 111, 211, 311 and the second core member 112, 212, 312.

According to an aspect of the present disclosure, a current sensing device for sensing a current may be provided. The current sensing device includes a core and a magnetic sensor. The core has a gap. The magnetic sensor is inserted in the gap of the core and configured to detect a magnetic flux that is generated in the core in response to the current, thereby sensing the current. The core includes a first core member and a second core member each made of a grain-oriented magnetic steel sheet, which has a magnetization easy axis in a predetermined direction thereof. The first core member and the second core member are stacked into a multiple layer structure so that a direction of the magnetization easy axis of the first core member and that of the second core member are perpendicular to each other. The first core member has a first trap part that suppresses flow of the magnetic flux in the first core member in a direction perpendicular to the magnetization easy axis of the first core member. The second core member has a second trap part that suppresses flow of the magnetic flux in the second core member in a direction perpendicular to the magnetization easy axis of the second core member.

Alternatively, the above current sensing device may be configured in the following manners.

The first trap part of the first core member may be a through-hole formed in the first core member. The second trap part of the second core member may be a through-hole formed in the second core member.

Alternatively, the above current sensing device may be configured in the following manners. The first core member may be multiple first core members. The second core member may be multiple second core members. The multiple first core members and the multiple second core members may be alternately stacked into the multilayer structure.

Alternatively, the above current sensing device may be configured in the following manners. The first trap part may be located at a first input output path part of a magnetic path formed in the first core member, wherein from the first input output part, the magnetic path extends into the direction perpendicular to the magnetization easy axis of the first core member. The second trap part may be located at a second input output path part of a magnetic path formed in the second core member, wherein from the second input output path part, the magnetic path extends into the direction perpendicular to the magnetization easy axis of the second core member.

Alternatively, the above current sensing device may be configured in the following manners. The first trap part may be provided in the first core member so that the first core member is one integrated member, in which portions are connected with each other. The second trap part may be provided in the second core member so that the second core member is one integrated member, in which portions are connected with each other.

According to another aspect of the present disclosure, there may be provided a method of manufacturing a core of a current sensing device, the current sensing device including a magnetic sensor inserted in a gap of the core to detect a magnetic flux that is generated in the core in response to a current to sense the current. The method includes: forming a first core member that is made of a grain-oriented magnetic steel sheet having a magnetization easy axis in a predetermination direction thereof, and that has a first trap part which suppresses flow of the magnetic flux in the first core member in a direction perpendicular to the magnetization easy axis of the first core member; forming a second core member that is made of a grain-oriented magnetic steel sheet having a magnetization easy axis in a predetermination direction thereof, and that has a second trap part which suppresses flow of the magnetic flux in the second core member in a direction perpendicular to the magnetization easy axis of the second core member; and stacking the first core member and the second core member into a multilayer structure so that the magnetization easy axis of the first core member and that of the second core member are perpendicular to each other.

According to the above current sensing device and the manufacturing method, each of the first core member and the second core member are made of a grain-oriented magnetic steel sheet, which has a magnetization easy axis in a predetermination direction thereof. The first core member and the second core member are stacked into a multilayer structure so that the direction of the magnetization easy axis of the first core member and that of the second core member are perpendicular to each other. The first core member has the first trap part, and the second core member has the second trap part. The flow of magnetic flux in the first core member in the direction perpendicular to the magnetization easy axis of the first core member can be suppressed by the first trap part. The flow of magnetic flux in the second core member in the direction perpendicular to the magnetization easy axis of the second core member can be suppressed by the second trap part. Because of the multilayer structure and the first and second trap parts, the first core member and the second core member can cooperate with each other to form a magnetic circuit in which the magnetic flux is guided to a magnetization easy axis portion (i.e., a portion that extends in the direction of the magnetization easy axis and that allows the magnetic flux to flow therein in the direction of the magnetization easy axis). Therefore, even if there is a clearance between the first core member and the second core member, the current sensing device can provide an ideal property of output in response to a current to be measured.

What is claimed is:

1. A current sensing device for sensing a current, comprising:
   a core having a gap; and
   a magnetic sensor inserted in the gap of the core and configured to detect a magnetic flux that is generated in the core in response to the current, thereby sensing the current, wherein:
   the core includes a plurality of first core members and a plurality of second core member, each being made of a grain-oriented magnetic steel sheet having a magnetization easy axis in a predetermined direction thereof;
   the plurality of first core members and the plurality of second core members are alternately stacked into a multiple layer structure so that a direction of the magnetization easy axis of each first core member and that of each second core member are perpendicular to each other;
   each first core member has a through-hole as a first trap part that suppresses flow of the magnetic flux in a respective first core member in a direction perpendicular to the magnetization easy axis of the respective first core member; and
   each second core member has a through-hole as a second trap part that suppresses flow of the magnetic flux in a respective second core member in a direction perpendicular to the magnetization easy axis of the respective second core member.

2. The current sensing device according to claim 1, wherein:
   each first trap part of a respective first core member is located at a first input output path part of a magnetic path formed in the respective first core member, wherein from the first input output part of the respective first core member, the magnetic path extends into the direction perpendicular to the magnetization easy axis of the respective first core member; and each second trap part of a respective second core member is located at a second input output path part of a magnetic path formed in the respective second core member, wherein from the second input output path part of the respective second core member, the magnetic path extends into the direction perpendicular to the magnetization easy axis of the respective second core member.

3. The current sensing device according to claim 1, wherein:

each first trap part of a respective first core member is provided in the respective first core member so that the respective first core member is one integrated member, in which a plurality of portions are connected with each other; and each second trap part of a respective second core member is provided in the respective second core member so that the respective second core member is one integrated member, in which a plurality of portions are connected with each other.

4. The current sensing device according to claim 1, wherein each first trap part that suppresses flow of the magnetic flux in a respective first core member in a direction perpendicular to the magnetization easy axis of the respective first core member further promotes flow of magnetic flux in a direction along the magnetization easy axis of an adjacent second core member, the direction along the magnetization easy axis of the adjacent second core member being perpendicular to the magnetization easy axis of the respective first core member, and each second trap part that suppresses flow of the magnetic flux in a respective second core member in a direction perpendicular to the magnetization easy axis of the respective second core member further promotes flow of magnetic flux in a direction along the magnetization easy axis of an adjacent first core member, the direction along the magnetization easy axis of the adjacent first core member being perpendicular to the magnetization easy axis of the respective second core member.

5. The current sensing device according to claim 1, wherein:

each first trap in the plurality of first core members is formed in the shape of a quadrilateral, and each second trap in the plurality of the second core members is also formed in the shape of a quadrilateral.

6. The current sensing device according to claim 1, wherein:

each first trap in the plurality of first core members is formed in the shape of a circle, and each second trap in the plurality of the second core members is also formed in the shape of a circle.

7. The current sensing device according to claim 1, wherein:

either each of the plurality of first core members or each of the plurality of second core members have a single first trap, and the other of the each of the plurality of first core members or each of the plurality of second core members have two second traps.

8. A current sensing device for sensing a current, comprising:

a core having a gap; and a magnetic sensor inserted in the gap of the core and configured to detect a magnetic flux that is generated in the core in response to the current, thereby sensing the current, wherein:

the core includes a first core member and a second core member each made of a grain-oriented magnetic steel sheet, which has a magnetization easy axis in a predetermined direction thereof;

the first core member and the second core member are stacked into a multiple layer structure so that a direction of the magnetization easy axis of the first core member and that of the second core member are perpendicular to each other;

the first core member has a first trap part that suppresses flow of the magnetic flux in the first core member in a direction perpendicular to the magnetization easy axis of the first core member; and the second core member has a second trap part that suppresses flow of the magnetic flux in the second core member in a direction perpendicular to the magnetization easy axis of the second core member, wherein each of the first core member and the second core member has a rectangular ring shape, which has two short side portions and two long side portions;

each of the two short side portions of the first core member extends in the direction perpendicular to the magnetization easy axis of the first core member;

each of the two long side portions of the first core member extends in the direction parallel to the magnetization easy axis of the first core member;

the first trap part is formed in at least one of the two short side portions of the first core member;

each of the two short side portions of the second core member extends in the direction parallel to the magnetization easy axis of the second core member;

each of the two long side portions of the second core member extends in the direction parallel to the magnetization easy axis of the second core member; and the second trap part is formed in at least one of the two long side portions of the second core member.

* * * * *